(12) United States Patent
Kwon et al.

(10) Patent No.: US 10,263,210 B2
(45) Date of Patent: Apr. 16, 2019

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventors: Younggil Kwon, Yongin-si (KR); Jiyoung Choung, Yongin-si (KR); Seul Lee, Yongin-si (KR); Jinbaek Choi, Yongin-si (KR)

(73) Assignee: Samsung Display Co., Ltd, Yongin-si (KR)

( * ) Notice: Subject to any disclaimer, the term of this patent is extended or adjusted under 35 U.S.C. 154(b) by 0 days.

(21) Appl. No.: 16/133,690

(22) Filed: Sep. 17, 2018

(65) Prior Publication Data
US 2019/0019977 A1 Jan. 17, 2019

Related U.S. Application Data

(63) Continuation of application No. 15/866,461, filed on Jan. 10, 2018, now Pat. No. 10,090,484.

(30) Foreign Application Priority Data

Mar. 10, 2017 (KR) .................. 10-2017-0030311

(51) Int. Cl.
  *H01L 51/52* (2006.01)
  *H01L 27/32* (2006.01)
(52) U.S. Cl.
  CPC ...... *H01L 51/5203* (2013.01); *H01L 27/3209* (2013.01)
(58) Field of Classification Search
  CPC ............. H01L 51/5203; H01L 51/0016; H01L 51/0023; H01L 51/5228; H01L 51/5259; H01L 51/56; H01L 27/3209
  See application file for complete search history.

(56) References Cited

U.S. PATENT DOCUMENTS

| 9,899,636 B2 * | 2/2018 | Defranco ............... H01L 51/56 |
| 2008/0203896 A1 * | 8/2008 | Ryu ....................... H01J 29/24 313/498 |

(Continued)

FOREIGN PATENT DOCUMENTS

| JP | 2008-085200 | 4/2008 |
| KR | 10-2012-0044876 | 5/2012 |

(Continued)

OTHER PUBLICATIONS

Notice of Allowance dated May 23, 2018, issued in U.S. Appl. No. 15/866,461.

*Primary Examiner* — Anne M Hines
(74) *Attorney, Agent, or Firm* — H.C. Park & Associates, PLC

(57) ABSTRACT

An organic light-emitting display apparatus includes: a first pixel electrode and a second pixel electrode disposed on a substrate; a pixel-defining film disposed on the first pixel electrode and the second pixel electrode and having openings through which the first pixel electrode and the second pixel electrode are exposed; a first intermediate layer and a second intermediate layer respectively disposed on the first pixel electrode and the second pixel electrode, the first intermediate layer and the second intermediate layer respectively comprising a first emission layer and a second emission layer; a first counter electrode and a second counter electrode respectively disposed on the first intermediate layer and the second intermediate layer; a first layer and a second layer respectively disposed on the first counter electrode and the second counter electrode and comprising fluorine; and a connection layer disposed on the first layer and the second layer and electrically connected to the first counter electrode and the second counter electrode.

12 Claims, 20 Drawing Sheets

(56) References Cited

U.S. PATENT DOCUMENTS

| | | | |
|---|---|---|---|
| 2008/0203898 A1 | 8/2008 | Kobayashi | |
| 2010/0289019 A1 | 11/2010 | Katz et al. | |
| 2011/0232954 A1* | 9/2011 | Sirringhaus | H01L 51/0016 |
| | | | 174/260 |
| 2012/0104422 A1* | 5/2012 | Lee | H01L 27/326 |
| | | | 257/88 |
| 2012/0169683 A1* | 7/2012 | Hong | H01L 27/3211 |
| | | | 345/206 |
| 2012/0268696 A1* | 10/2012 | Yim | G09G 3/32 |
| | | | 349/104 |
| 2016/0248039 A1 | 8/2016 | Choung et al. | |
| 2017/0365812 A1 | 12/2017 | Choung et al. | |

FOREIGN PATENT DOCUMENTS

| | | |
|---|---|---|
| KR | 10-2016-0103594 | 9/2016 |
| KR | 10-2017-0142231 | 12/2017 |
| WO | 2008/038588 | 4/2008 |

\* cited by examiner

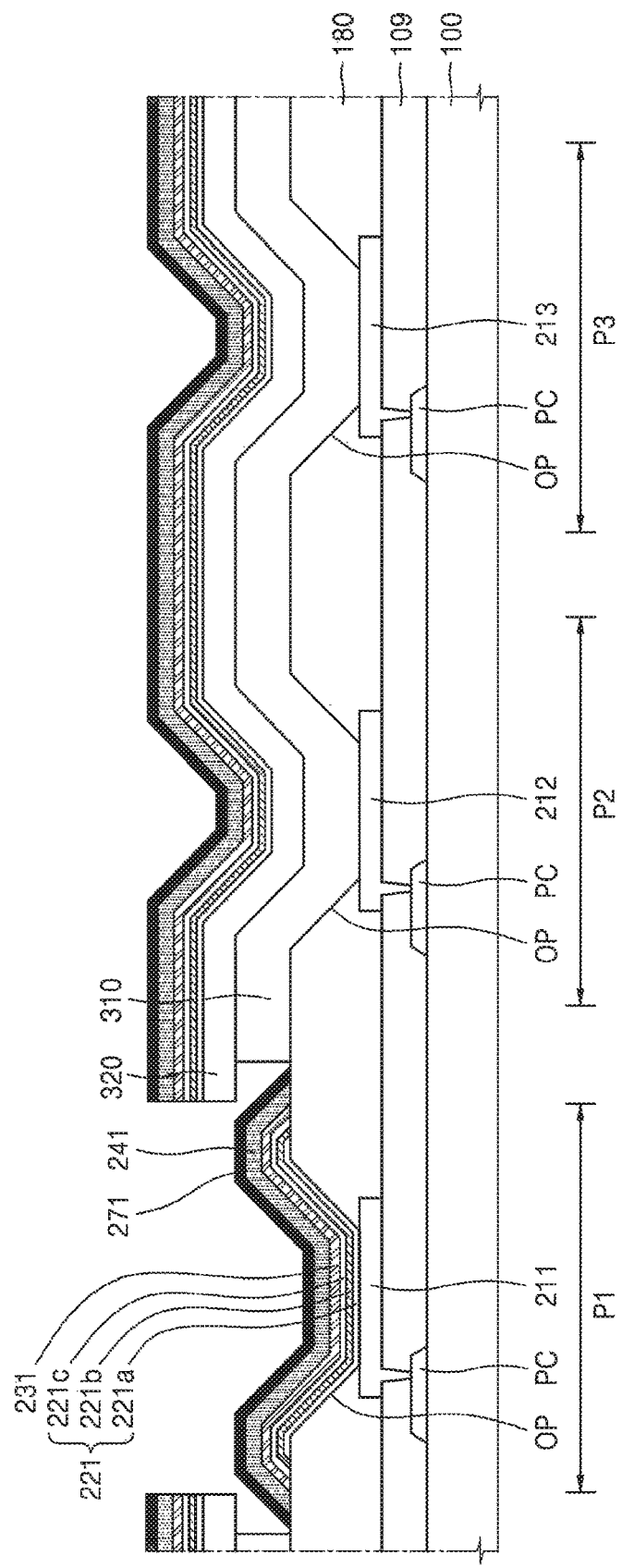

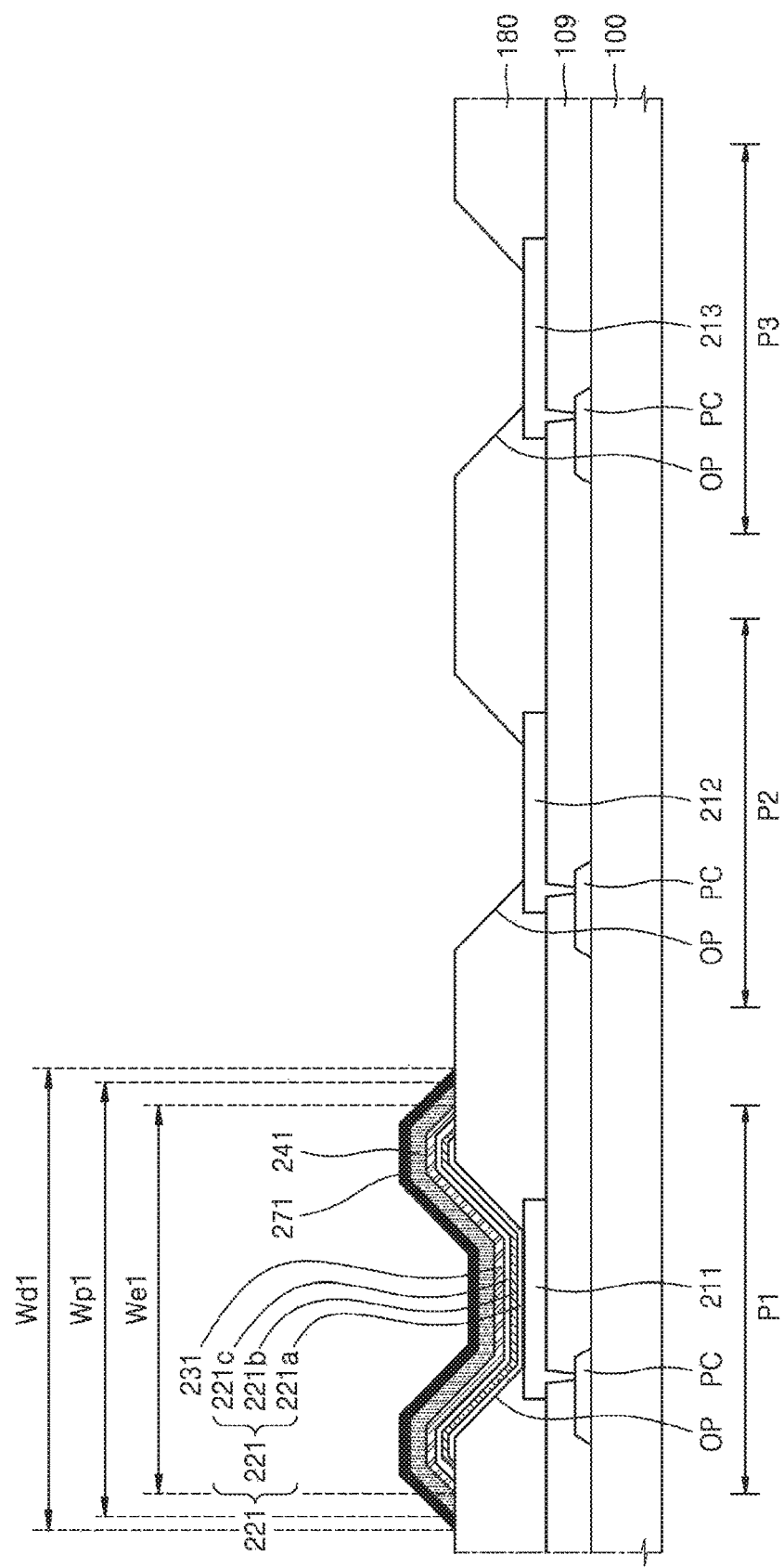

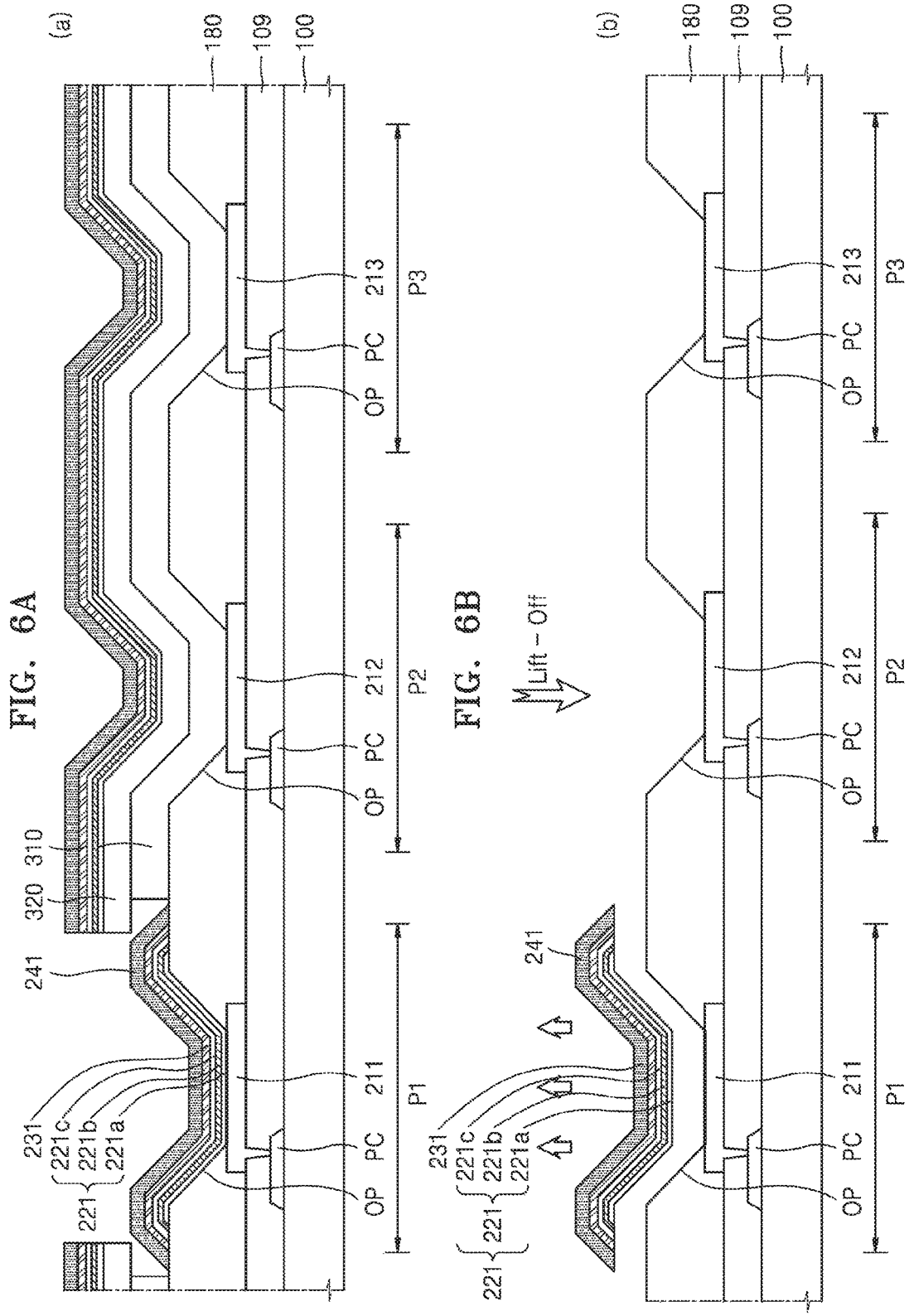

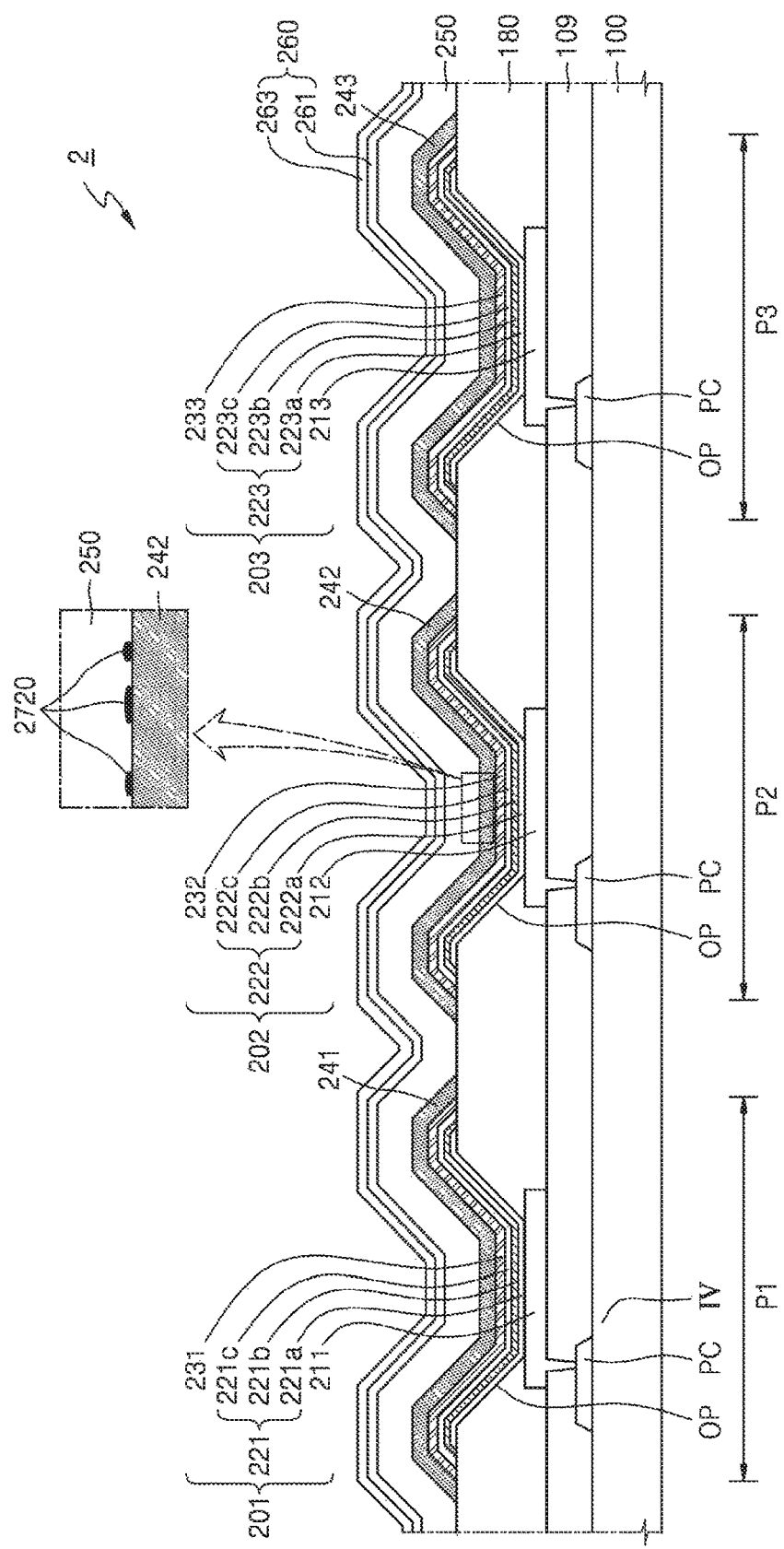

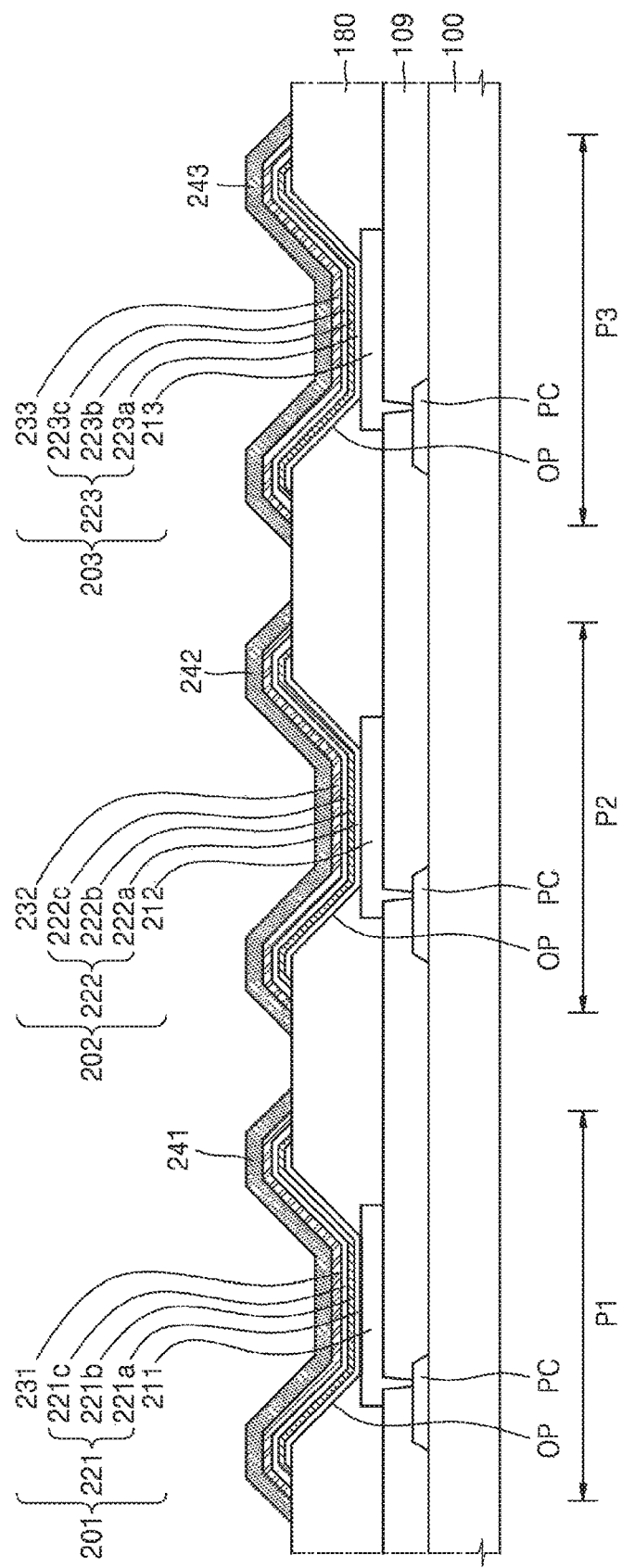

ORGANIC LIGHT-EMITTING DISPLAY APPARATUS AND METHOD OF MANUFACTURING THE SAME

CROSS-REFERENCE TO RELATED APPLICATIONS

This application is a Continuation of U.S. patent application Ser. No. 15/866,461, filed on Jan. 10, 2018, which claims priority from and the benefit of Korean Patent Application No. 10-2017-0030311, filed on Mar. 10, 2017, which are hereby incorporated by reference for all purposes as if fully set forth herein.

BACKGROUND

Field

The invention relates generally to organic light-emitting display apparatuses, and more particularly, to organic light-emitting display apparatuses and methods of manufacturing organic light-emitting apparatuses that may be produced at reduced manufacturing costs and can simplify the overall manufacturing process.

Discussion of the Background

Organic light-emitting display apparatuses are widely used as next generation display apparatuses because of their wide viewing angle, short response time, and low power consumption as well as thin and light design.

In an organic light-emitting display apparatus capable of displaying a full color image, light having different colors is emitted from pixel regions and an organic emission layer of each pixel is formed using a deposition mask. As the organic light-emitting display apparatus has higher resolution, the widths of open slits of fine metal masks used during deposition processes have become narrower and the spacing between the open slits are required to be further reduced. Also, in order to manufacture organic light-emitting display apparatuses having even higher resolutions, it is necessary to reduce or remove shadow effects. Accordingly, methods of performing deposition processes with substrates and masks in close contact may be used.

Applicants discovered that when a deposition process is performed in a state where a substrate and a mask are in close contact, the mask may inappropriately contact the substrate. In order to prevent this problem, a method involving locating a spacer on a pixel-defining film is used. However, in this case, an additional manufacturing step is added, and a thickness of an organic light-emitting display apparatus is increased due to the spacer.

The above information disclosed in this Background section is only for enhancement of understanding of the background of the inventive concepts, and, therefore, it may contain information that does not constitute prior art.

SUMMARY

Organic light-emitting display apparatuses and manufacturing methods thereof according to the principles of the invention employ a lift-off process without using a fine metal mask that prevents a deposition mask from inappropriately touching a substrate, thereby reducing manufacturing costs, and simplifying the overall manufacturing process.

Additional aspects will be set forth in part in the description which follows and, in part, will be apparent from the disclosure, or may be learned by practice of the inventive concepts.

According to one aspect of the invention, a method of manufacturing an organic light-emitting display apparatus includes the steps of forming a first pixel electrode and a second pixel electrode on a substrate, forming a pixel-defining film on the first pixel electrode and the second pixel electrode, the pixel-defining film having an opening through which each of the first pixel electrode and the second pixel electrode is exposed, forming a first masking pattern on the pixel-defining film having a first opening portion through which the first pixel electrode is exposed, sequentially forming a first intermediate layer including a first emission layer, a first counter electrode, a first protective layer, and a first anti-decapping layer on the first pixel electrode and the first masking pattern, and removing the first masking pattern along with the first intermediate layer, the first counter electrode, the first protective layer, and the first anti-decapping layer disposed on the first masking pattern.

The first anti-decapping layer may be formed of a material including fluorine.

The first protective layer may be formed of a material including transparent conductive oxide.

The first protective layer may be formed to have a width greater than a width of the first counter electrode.

The first protective layer may be formed to have an end portion directly contacting the pixel-defining film.

The first masking pattern may include a material other than fluorine.

The first masking pattern may be formed using a photolithography process.

The first intermediate layer may be formed using a deposition process.

The first anti-decapping layer may be formed to have a width greater than a width of the first protective layer.

The method may further include the step of forming a second masking pattern on the first anti-decapping layer and the pixel-defining film, the second masking pattern having a second opening portion through which the second pixel electrode is exposed, sequentially forming a second intermediate layer including a second emission layer, a second counter electrode, a second protective layer, and a second anti-decapping layer on the second pixel electrode and the second masking pattern, and removing the second masking pattern along with the second intermediate layer, the second counter electrode, the second protective layer, and the second anti-decapping layer disposed on the second masking pattern.

The method may further include the step of respectively forming through-holes in the first anti-decapping layer and the second anti-decapping layer, and forming a connection layer on the first anti-decapping layer and the second anti-decapping layer to cover the first anti-decapping layer and the second anti-decapping layer.

The through-holes may be formed to expose top surfaces of the first protective layer and the second protective layer.

The method may further include the steps of removing the first anti-decapping layer and the second anti-decapping layer, and forming a connection layer on the first protective layer and the second protective layer to cover the first protective layer and the second protective layer.

The first anti-decapping layer and the second anti-decapping layer may be removed using plasma treatment.

According to another aspect of the invention, an organic light-emitting display apparatus includes a first pixel electrode and a second pixel electrode disposed on a substrate, a pixel-defining film disposed on the first pixel electrode and the second pixel electrode and having openings through which the first pixel electrode and the second pixel electrode are exposed, a first intermediate layer and a second intermediate layer respectively disposed on the first pixel electrode and the second pixel electrode, the first pixel electrode and the second pixel electrode respectively including a first emission layer and a second emission layer, a first counter electrode and a second counter electrode respectively disposed on the first intermediate layer and the second intermediate layer and having island-type patterns, a first protective layer and a second protective layer respectively disposed on the first counter electrode and the second counter electrode and having island-type patterns; a first anti-decapping layer and a second anti-decapping layer respectively disposed on the first protective layer and the second protective layer, and a connection layer disposed on the first anti-decapping layer and the second anti-decapping layer and electrically connected to the first counter electrode and the second counter electrode.

Each of the first anti-decapping layer and the second anti-decapping layer may include fluorine.

Each of the first protective layer and the second protective layer may include a transparent conductive oxide.

The first protective layer may have a width greater than a width of the first counter electrode, and the second protective layer may have a width greater than a width of the second counter electrode.

An end portion of each of the first protective layer and the second protective layer may directly contact the pixel-defining film.

The first anti-decapping layer and the second anti-decapping layer may have island-type patterns covering the first protective layer and the second protective layer.

The first anti-decapping layer and the second anti-decapping layer may have through-holes through which top surfaces of the first protective layer and the second protective layer are exposed. The first protective layer and the second protective layer may directly contact the connection layer through the through-holes.

The first anti-decapping layer may have a width greater than a width of the first protective layer, and the second anti-decapping layer may have a width greater than a width of the second protective layer.

The first anti-decapping layer and the second anti-decapping layer may be disposed on the first protective layer and the second protective layer, and each may include distributed particles.

The first protective layer and the second protective layer may directly contact the connection layer through spaces between the distributed particles of the first anti-decapping layer and the second anti-decapping layer.

The connection layer may integrally cover the first protective layer and the second protective layer.

According to another aspect of the invention, an organic light-emitting display apparatus includes: a first pixel electrode and a second pixel electrode disposed on a substrate; a pixel-defining film disposed on the first pixel electrode and the second pixel electrode and having openings through which the first pixel electrode and the second pixel electrode are exposed; a first intermediate layer and a second intermediate layer respectively disposed on the first pixel electrode and the second pixel electrode, the first intermediate layer and the second intermediate layer respectively comprising a first emission layer and a second emission layer; a first counter electrode and a second counter electrode respectively disposed on the first intermediate layer and the second intermediate layer; a first layer and a second layer respectively disposed on the first counter electrode and the second counter electrode and comprising fluorine; and a connection layer disposed on the first layer and the second layer and electrically connected to the first counter electrode and the second counter electrode.

The organic light-emitting display apparatus may further include a first protective layer and a second protective layer respectively disposed on the first counter electrode and the second counter electrode.

The first protective layer and the second protective layer respectively may have island-type patterns.

Each of the first protective layer and the second protective layer may include a transparent conductive oxide.

The first protective layer may have a width greater than a width of the first counter electrode, and the second protective layer has a width greater than a width of the second counter electrode.

An end portion of each of the first protective layer and the second protective layer may directly contact the pixel-defining film.

The first layer and the second layer may have island-type patterns covering the first protective layer and the second protective layer.

The first layer and the second layer may have through-holes through which top surfaces of the first protective layer and the second protective layer are exposed, wherein the first protective layer and the second protective layer directly may contact the connection layer through the through-holes.

The first layer may have a width greater than a width of the first protective layer, and the second layer has a width greater than a width of the second protective layer.

The first layer and the second layer may be disposed on the first protective layer and the second protective layer, and each comprises distributed particles.

The first protective layer and the second protective layer directly may contact the connection layer through spaces between the distributed particles of the first layer and the second layer.

The first counter electrode and the second counter electrode respectively may have island-type patterns.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIGS. 5A through 5M are schematic cross-sectional views of an organic light-emitting display apparatus illustrating an exemplary method of manufacturing the organic light-emitting display apparatus according to the principles of the invention.

FIGS. 6A and 6B are schematic cross-sectional views of an organic light-emitting display apparatus showing a stripping process that may be employed without a first anti-decapping layer.

FIG. 7 is a schematic cross-sectional view of a second embodiment of an organic light-emitting display apparatus constructed according to the principles of the invention.

FIGS. 8A and 8B are schematic cross-sectional views of the organic light-emitting display apparatus of FIG. 7 illustrating a part of an exemplary method of manufacturing the organic light-emitting display apparatus.

DETAILED DESCRIPTION OF THE ILLUSTRATED EMBODIMENTS

Figure 1:
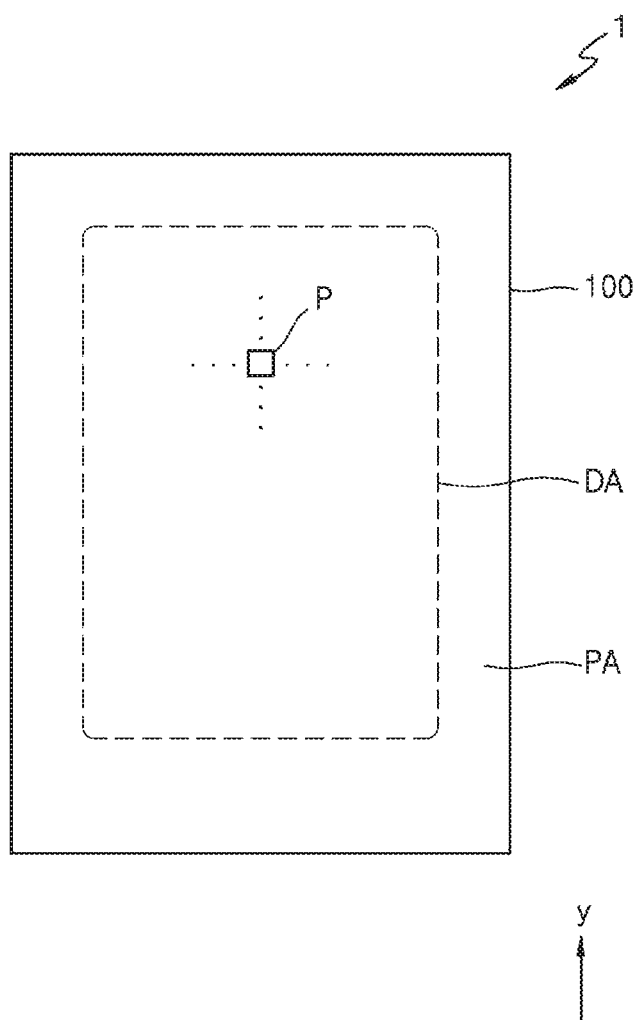
FIG. 1 is a schematic plan view of an embodiment of an organic light-emitting display apparatus constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic plan view of an embodiment of an organic light-emitting display apparatus constructed according to the principles of the invention.

Referring to FIG. 1, the organic light-emitting display apparatus 1 includes a substrate 100. The substrate 100 includes a display area DA and a peripheral area PA outside the display area DA.

Pixels P including an organic light-emitting device (OLED) may be located in the display area DA of the substrate 100. Various wirings for transmitting an electrical signal to be applied to the display area DA may be located in the peripheral area PA of the substrate 100 that is an area where an image is not displayed.

Figure 2:
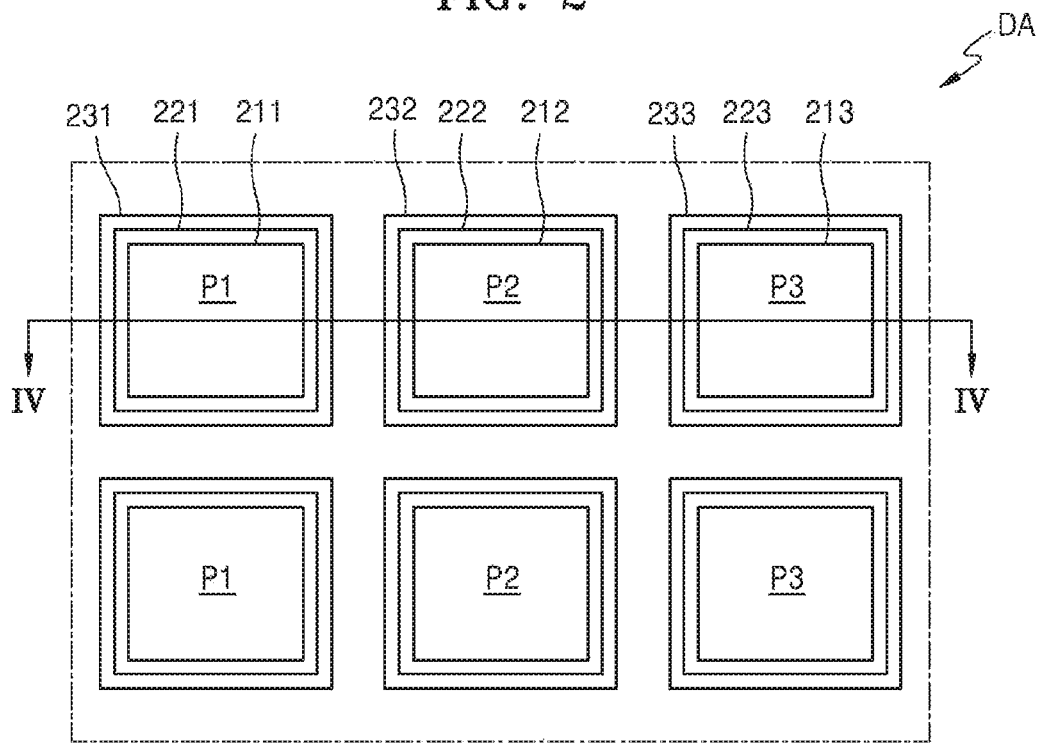
FIG. 2 is a schematic plan view of a part of a display area of the organic light-emitting display apparatus of FIG. 1.
Figure 3:
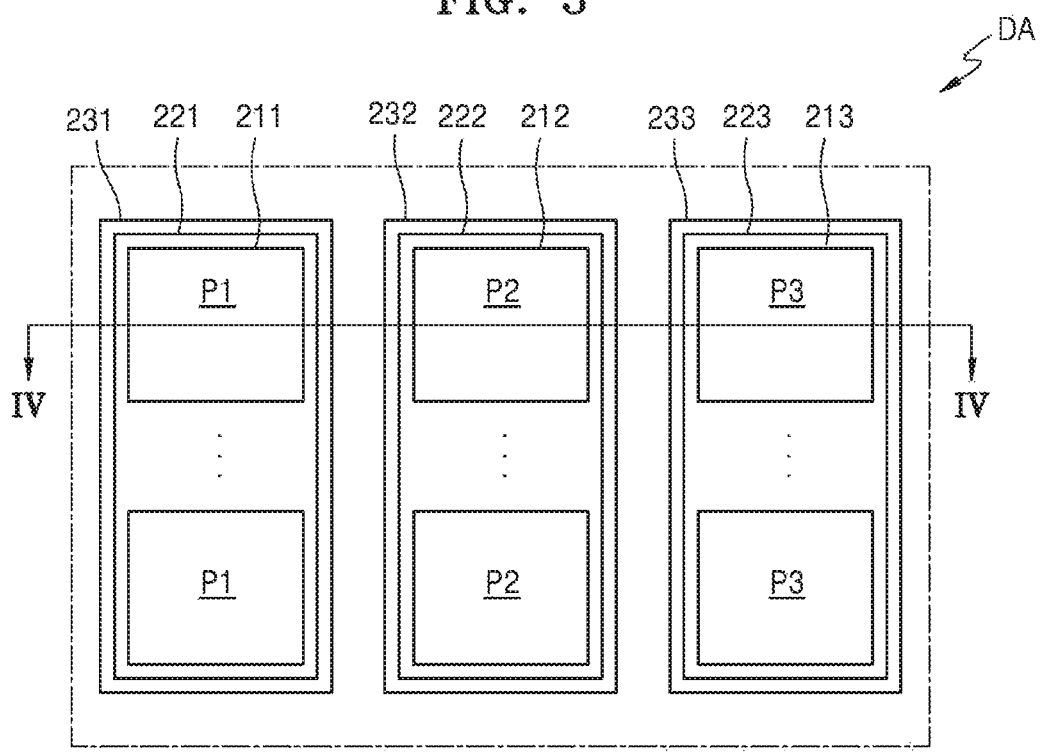
FIG. 3 is a schematic plan view of another embodiment of a part of a display area of the organic light-emitting display apparatus of FIG. 1.
Figure 4:
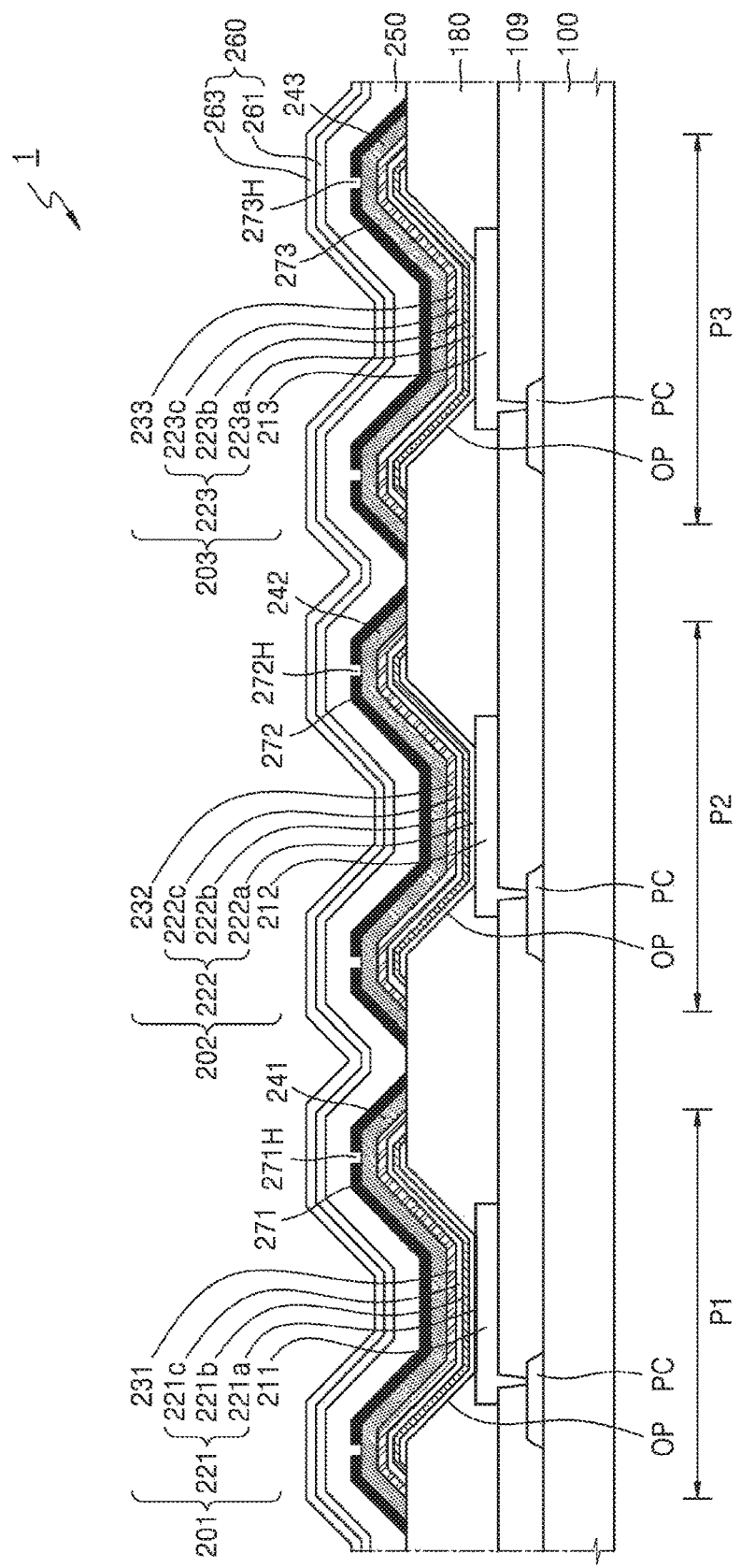
FIG. 4 is a schematic cross-sectional view of a first embodiment of the organic light-emitting display apparatus taken along sectional line IV-IV of FIGS. 2 and 3.

FIG. 2 is a schematic plan view of a part of a display area of the organic light-emitting display apparatus of FIG. 1. FIG. 3 is a schematic plan view of another embodiment of a part of a display area of the organic light-emitting display apparatus of FIG. 1. FIG. 4 is a schematic cross-sectional view of a first embodiment of the organic light-emitting display apparatus taken along sectional line IV-IV of FIGS. 2 and 3.

Referring to FIGS. 2 through 4, the display area DA includes pixels P1, P2, and P3 that emit light of different colors. For descriptive convenience, the pixels P1, P2, and P3, which may emit light of different colors, are respectively referred to as a first pixel, a second pixel, and a third pixel.

In an exemplary embodiment, the first pixel P1 may emit red light, the second pixel P2 may emit green light, and the third pixel P3 may emit blue light. Although three pixels, the first through third pixels P1, P2, and P3, are located in the display area DA in the illustrated embodiment, the inventive concepts are not limited thereto. In another exemplary embodiment, a fourth pixel that emits white light may be further included in addition to the first through third pixels P1, P2, and P3.

The first through third pixels P1, P2, and P3 respectively include pixel circuits PC and first through third OLEDs 201, 202 and 203 (see FIG. 4) electrically connected to the pixel circuits PC.

The pixel circuits PC are connected to first through third pixel electrodes 211, 212, and 213 of the first through third OLEDs 201, 202, and 203, respectively, through contact holes formed in an insulating layer 109.

The first OLED 201 includes the first pixel electrode 211, a first intermediate layer 221, and a first counter electrode 231.

Each of the first pixel electrode 211, the first intermediate layer 221, and the first counter electrode 231 has an island-type pattern. An island-type pattern indicates that a certain portion is distinguished from portions around it. As shown in FIG. 2, each of the first pixel electrode 211, the first intermediate layer 221, and the first counter electrode 231 may be patterned into an island shape in each first pixel P1, or as shown in FIG. 3, the first intermediate layer 221 and the first counter electrode 231 may be commonly patterned into a strip shape to include a plurality of the first pixels P1.

The first intermediate layer 221 may include a first emission layer 221b that emits red light, and may further include first and second functional layers 221a and 221c located over and/or under the first emission layer 221b. The first functional layer 221a may include a hole s injection layer (HIL) and/or a hole transport layer (HTL), and the second functional layer 221c may include an electron transport layer (ETL) and/or an electron injection layer (EIL). The first intermediate layer 221 may selectively include the first and/or second functional layers 221a and 221c.

The second OLED 202 includes the second pixel electrode 212, a second intermediate layer 222, and a second counter electrode 232.

Each of the second pixel electrode 212, the second intermediate layer 222, and the second counter electrode 232 has an island-type pattern. As shown in FIG. 2, each of the second pixel electrode 212, the second intermediate layer 222, and the second counter electrode 232 may be patterned into an island shape in each second pixel P2, or as shown in FIG. 3, the second intermediate layer 222 and the second counter electrode 232 may be commonly patterned into a strip shape to include a plurality of the second pixels P2.

The second intermediate layer 222 may include a second emission layer 222b that emits green light, and may further include first and second functional layers 222a and 222c located over and/or under the second emission layer 222b. The first functional layer 222a may include an HIL and/or an HTL, and the second functional layer 222c may include an ETL and/or an EIL. The second intermediate layer 222 may selectively include the first and/or second functional layers 222a and 222c.

The third OLED 203 includes the third pixel electrode 213, a third intermediate layer 223, and a third counter electrode 233.

Each of the third pixel electrode 213, the third intermediate layer 223, and the third counter electrode 233 has an island-type pattern. As shown in FIG. 2, each of the third pixel electrode 213, the third intermediate layer 223, and the third counter electrode 233 may be patterned into an island shape in each third pixel P3, or as shown in FIG. 3, the third intermediate layer 223 and the third counter electrode 233 may be commonly patterned into a strip shape to include a plurality of the third pixels P3.

The third intermediate layer 223 may include a third emission layer 223b that emits blue light, and may further include first and second functional layers 223a and 223c located over and/or under the third emission layer 223b. The first functional layer 223a may include an HIL and/or an HTL, and the second functional layer 223c may include an ETL and/or an EIL. The third intermediate layer 223 may selectively include the first and/or second functional layers 223a and 223c.

The first through third pixel electrodes 211, 212, and 213 may be reflective electrodes or transmissive electrodes.

When the first through third pixel electrodes 211, 212, and 213 are reflective electrodes, each of the first through third pixel electrodes 211, 212, and 213 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof. Alternatively, each of the first through third pixel electrodes 211, 212, and 213 may include a reflective film and a transparent conductive oxide (TCO) film located over and/or under the reflective film.

When the first through third pixel electrodes 211, 212, and 213 are transmissive electrodes, each of the first through third pixel electrodes 211, 212, and 213 may be a TCO layer. Alternatively, each of the first through third pixel electrodes 211, 212, and 213 may be a metal thin film including Ag or an Ag alloy, or may have a multi-layer structure including a TCO layer formed on a metal thin film. In an exemplary embodiment, each of the first through third pixel electrodes 211, 212, and 213 may have a three-layer structure in which indium tin oxide (ITO), Ag, and ITO respectively having thicknesses of 70 Å, 850 Å, and 50 Å are sequentially stacked.

The first through third counter electrodes 231, 232, and 233 may be transmissive electrodes or reflective electrodes. Each of the first through third counter electrodes 231, 232, and 233 may be a metal thin film or a metal thick film including at least material selected from the group of silver (Ag), magnesium (Mg), aluminum (Al), ytterbium (Yb), calcium (Ca), lithium (Li), and gold (Au).

For example, each of the first through third counter electrodes 231, 232, and 233 may have a single-layer structure or a multi-layer structure including at least one of Ag, Mg, Al, Yb, Ca, LiF/Ca, LiF/Al, Al, and Au. In an exemplary embodiment, each of the first through third counter electrodes 231, 232, and 233 may include a metal thin film including Ag and Mg, wherein Ag content may be greater than Mg content.

Each of the first through third counter electrodes 231, 232, and 233 including the above materials may be formed as a transmissive electrode by reducing a thickness thereof or may be formed as a reflective electrode by increasing a thickness thereof. For example, a metal electrode including Ag and Mg may be formed having a thickness ranging from about 10 Å to about 15 Å to be used as a transmissive electrode, or may be formed having a thickness of about 50 nm or more to be used as a reflective electrode.

The first through third intermediate layers 221, 222, and 223 and the first through third counter electrodes 231, 232, and 233 may be manufactured using a lift-off process. For example, the lift-off process may be performed on each of first through third pixels P1, P2, and P3 and a photoresist may be used during the lift-off process. When a material included in the photoresist, for example, propylene glycol monomethyl ether acetate (PGMEA) or a material such as tetramethylammonium hydroxide (TMAH) included in a developing solution used during the photoresist penetrates into an OLED, the OLED may be damaged or deteriorated. In order to prevent this problem, first through third protective layers 241, 242, and 243 respectively covering the first through third OLEDs 201, 202, and 203 are formed on the first through third OLEDs 201, 202, and 203.

Each of the first through third protective layers 241, 242, and 243 may include TCO. For example, each of the first through third protective layers 241, 242, and 243 may include indium tin oxide (ITO), indium tin oxide nitride (ITON), indium zinc oxide (IZO), indium zinc oxide nitride (IZON), indium zinc tin oxide (IZTO), or aluminum zinc oxide (AZO).

The first through third protective layers 241, 242, and 243 have island-type patterns in the first through third pixels P1, P2, and P3. The first through third protective layers 241, 242, and 243 have widths greater than widths of the first through third counter electrodes 231, 232, and 233 located under the first through third protective layers 241, 242, and 243. End portions of the first through third protective layers 241, 242, and 243 may directly contact a pixel-defining film 180 along end portions of the first through third counter electrodes 231, 232, and 233.

Each of the first through third protective layers 241, 242, and 243 may be manufactured using a lift-off process. For example, the lift-off process may be performed on each of the first through third pixels P1, P2, and P3. In a stripping process to remove a lift-off layer formed of an organic material, the first through third protective layers 241, 242, and 243 each including TCO may fail to cap the first through third OLEDs 201, 202, and 203 due to a strong interaction with a stripping solvent that is an organic solvent and may decap from the first through third OLEDs 201, 202, and 203. Alternatively, the first through third protective layers 241, 242, and 243 may decap from the first through third pixels P1, P2, and P3 along with the first through third OLEDs 201, 202, and 203 (see FIG. 6B). As such, in order to prevent deterioration of the first through third OLEDs 201, 202, and 203 due to decapping of the first through third protective layers 241, 242, and 243, first through third anti-decapping layers 271, 272, and 273 respectively covering the first through third protective layers 241, 242, and 243 are formed on the first through third protective layers 241, 242, and 243.

Each of the first through third anti-decapping layers 271, 272, and 273 may be formed of a resin including fluorine. For example, a resin including fluorine having low surface energy may block a strong interaction between a stripping solvent that is an organic solvent and the first through third protective layers 241, 242, and 243 each including TCO.

The first through third anti-decapping layers 271, 272, and 273 include first through third through-holes 271H, 272H, and 273H through which top surfaces of the first through third protective layers 241, 242, and 243 are exposed. The first through third through-holes 271H, 272H, and 273H formed in the first through third anti-decapping layers 271, 272, and 273, each formed of a non-conductive material, function as paths through which the first through third counter electrodes 231, 232, and 233 and the first through third protective layers 241, 242, and 243, each formed of a conductive material, are electrically connected to a connection layer 250.

The first through third anti-decapping layers 271, 272, and 273 have island-type patterns in the first through third pixels P1, P2, and P3. The first through third anti-decapping layers 271, 272, and 273 may have widths greater than widths of the first through third protective layers 241, 242, and 243 located under the first through third anti-decapping layers 271, 272, and 273. End portions of the first through third anti-decapping layers 271, 272, and 273 may directly contact the pixel-defining film 180.

The connection layer 250 is integrally formed to cover the first through third anti-decapping layers 271, 272, and 273. The connection layer 250 contacts the first through third protective layers 241, 242, and 243 including TCO through the first through third through-holes 271H, 272H, and 273H, and is electrically connected to the first through third counter electrodes 231, 232, and 233. The connection layer 250 may prevent a voltage drop in a common voltage applied to the first through third OLEDs 201, 202, and 203.

The connection layer 250 is formed of a conductive material. In an exemplary embodiment, when the first through third pixel electrodes 211, 212, and 213 are reflective electrodes and the first through third counter electrodes 231, 232, and 233 are transmissive electrodes, the connection layer 250 may be formed of TCO. In another exemplary embodiment, when the first through third pixel electrodes 211, 212, and 213 are transmissive electrodes and the first through third counter electrodes 231, 232, and 233 are reflective electrodes, the connection layer 250 may be formed of any conductive material including TCO and a metal.

An encapsulation thin film 260 may be disposed on the connection layer 250. The encapsulation thin film 260 may include at least one organic layer 261 and at least one inorganic layer 263. The organic layer 261 may include a polymer-based material such as polymethylmethacrylate (PMMA), polycarbonate (PC), polystyrene (PS), acrylic resin, epoxy resin, polyimide, or polyethylene. The inorganic layer 263 may include at least one of aluminum nitride (AlN), aluminum oxide ($Al_2O_3$), titanium nitride (TiN), titanium oxide ($TiO_2$), silicon oxynitride (SiON), silicon nitride (SiNx), and silicon oxide (SiOx).

Although the inorganic layer 263 is disposed over the organic layer 261 in FIG. 4, the inventive concepts not limited thereto. In another exemplary embodiment, positions of the organic layer 261 and the inorganic layer 263 may be changed, and a stacking order and the number of layers may be varied.

FIGS. 5A through 5M are schematic cross-sectional views of an organic light-emitting display apparatus illustrating an exemplary method of manufacturing the organic light-emitting display apparatus according to the principles of the invention.

Figure 5A:
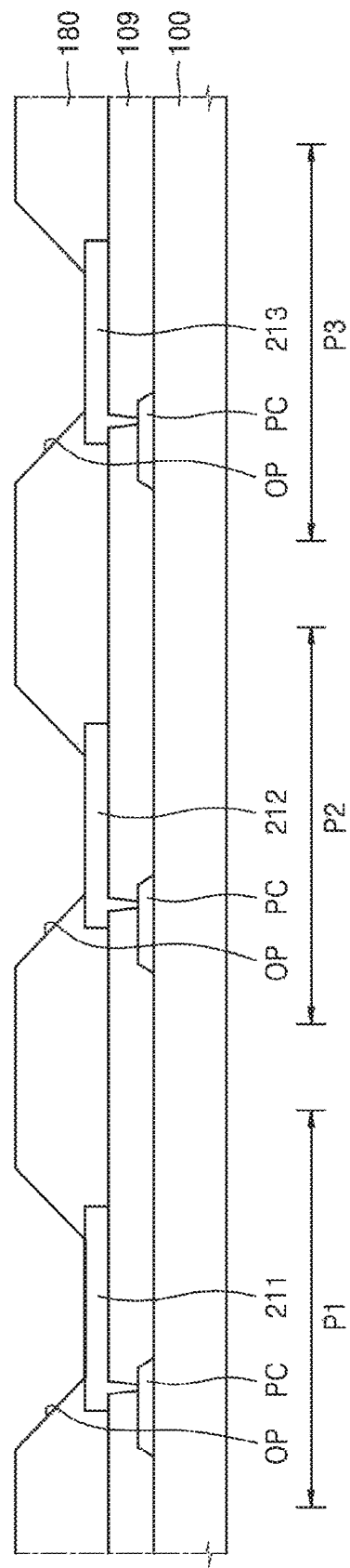

Referring to FIG. 5A, the pixel circuits PC, and the first through third pixel electrodes 211, 212, and 213 electrically connected to the pixel circuits PC are formed on the substrate 100, and the pixel-defining film 180 having openings OP through which the first through third pixel electrodes 211, 212, and 213 are exposed is formed.

The substrate 100 may include various materials such as a glass material or a plastic material (e.g., polyethylene terephthalate (PET), polyethylene naphthalate (PEN), or polyimide). Flexibility when the substrate 100 is formed of a plastic material may be greater than that when the substrate 100 is formed of a glass material. A buffer layer formed of SiOx and/or SiNx to prevent penetration of impurities may be formed on the substrate 100.

After the pixel circuits PC are formed on the substrate 100, contact holes are formed by patterning the insulating layer 109 that covers the pixel circuits PC. Next, a conductive material layer is formed and then the first through third pixel electrodes 211, 212, and 213 are formed by patterning the conductive material layer.

The conductive material layer may include a reflective film formed of Mg, Al, Pt, Pd, Au, Ni, Nd, Ir, Cr, or a compound thereof, or may include a TCO film located over or under the reflective film. Alternatively, the conductive material layer may be a thin film including Ag, or an Ag alloy, or may include a TCO film formed on a thin film. The first through third pixel electrodes 211, 212, and 213 may be reflective electrodes or transmissive electrodes according to the conductive material layer, and their detailed configuration is substantially the same as that described with reference to FIG. 4.

Thereafter, an organic insulating film is formed and the pixel-defining film 180 is formed by patterning the organic insulating film. The pixel-defining film 180 has the openings OP through which the first through third pixel electrodes 211, 212, and 213 are exposed. Although the pixel-defining film 180 is formed of an organic insulating material in the illustrated embodiment, the inventive concepts are not limited thereto. In another exemplary embodiment, the pixel-defining film 180 may be formed of an organic insulating material and an inorganic insulating material, or an inorganic insulating material, and may have a single-layer structure or a multi-layer structure including the above materials.

Figure 5B:
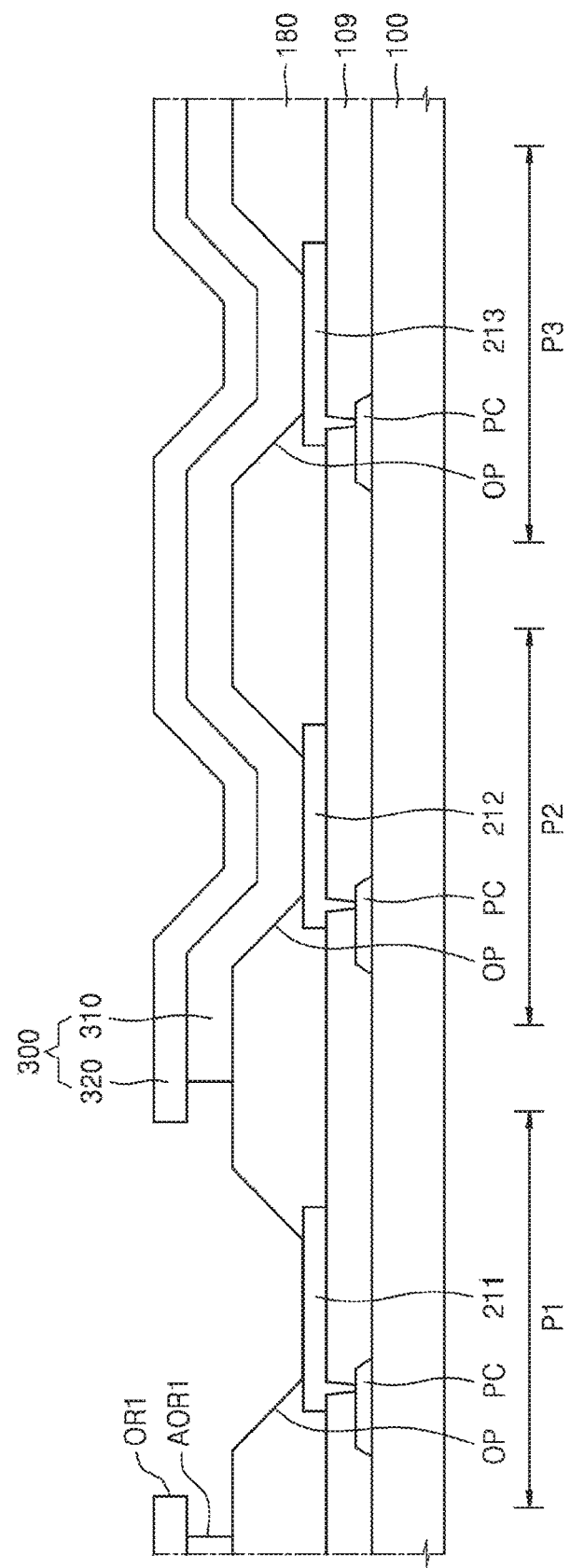

Referring to FIG. 5B, a first masking pattern 300 including a first photosensitive pattern layer 320 is formed on the pixel-defining film 180. The first masking pattern 300 may further include a first auxiliary layer 310 located between the first photosensitive pattern layer 320 and the pixel-defining film 180.

In an exemplary embodiment, the first masking pattern 300 may be formed using the following process.

A non-photosensitive organic material layer is formed on the substrate 100 and the pixel-defining film 180, and a photoresist layer is formed on the non-photosensitive organic material layer. When the non-photosensitive organic material layer includes a fluorine-based material, an etching solution for etching the non-photosensitive organic material layer has to include a fluorine-based material. As a fluorine-based material is used for the non-photosensitive organic material layer, manufacturing costs may be high and a fluorine residue may remain. In the illustrated embodiment, a fluorine-based material is not used for the non-photosensitive organic material layer. The photoresist layer may include a positive photosensitive material.

Thereafter, the first photosensitive pattern layer 320 having a first opening portion OR1 is formed by exposing and developing a portion of the photoresist layer corresponding to the first pixel P1. A first auxiliary opening portion AOR1 is formed by etching a portion of the non-photosensitive organic material layer exposed through the first opening portion OR1. The first auxiliary opening portion AOR1 of the first auxiliary layer 310 is formed by etching to be greater than the first opening portion OR1.

Figure 5C:
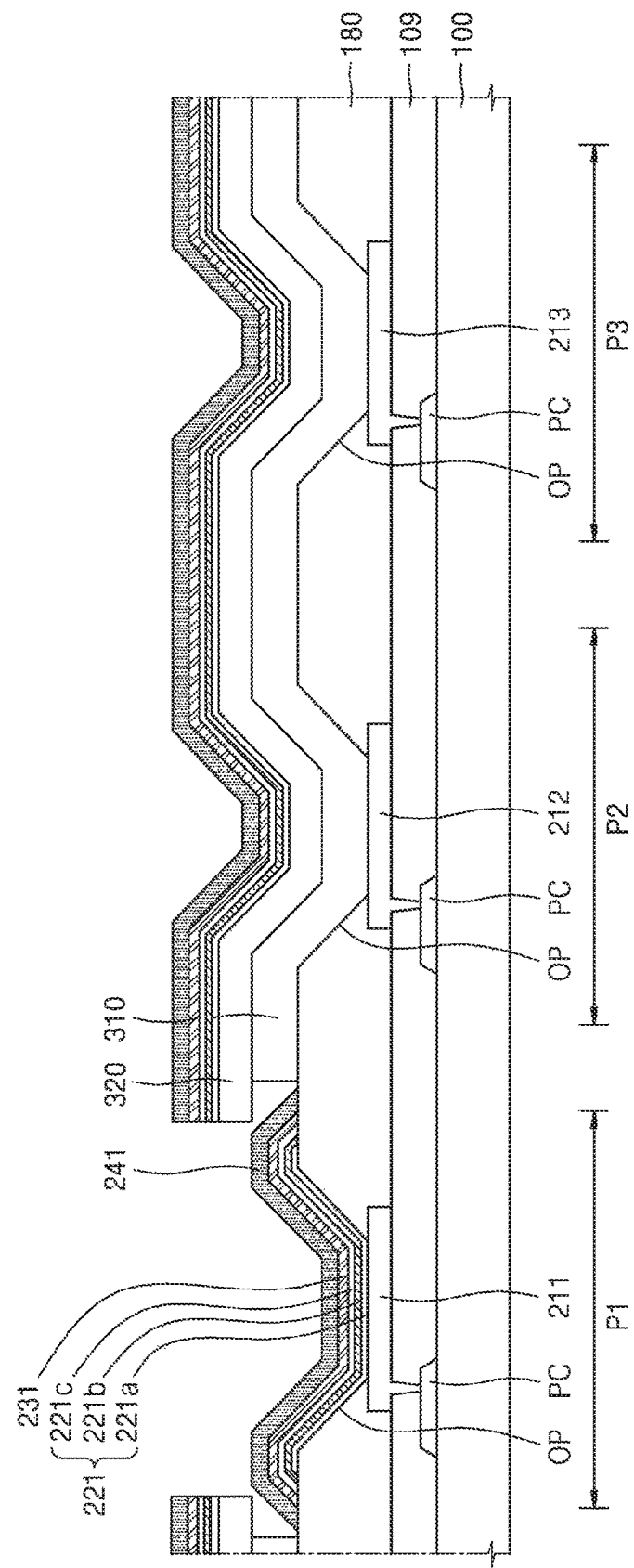

Referring to FIG. 5C, the first intermediate layer 221, the first counter electrode 231, and the first protective layer 241 are sequentially formed on the substrate 100 and the first masking pattern 300. The first intermediate layer 221 may include the first emission layer 221b that emits red light, and may include the first and second functional layers 221a and 222c located over or/and under the first emission layer 221b.

The first intermediate layer 221 and the first counter electrode 231 may be formed using thermal evaporation. Deposition materials for forming the first intermediate layer 221 and the first counter electrode 231 may move toward the substrate 100 in a direction perpendicular or oblique to the substrate 100. Accordingly, an end portion of the first intermediate layer 221 and an end portion of the first counter electrode 231 may extend into a space under the first photosensitive pattern layer 320 without contacting the first auxiliary layer 310. As the deposition materials are deposited in the oblique direction, the end portions of the first intermediate layer 221 and the first counter electrode 231 may have forward tapered shapes. The first intermediate layer 221 and the first counter electrode 231 include substantially the same material as that described with reference to FIG. 4, and thus a description thereof will not be given to avoid redundancy.

The first protective layer 241 may include TCO. For example, the first protective layer 241 may include at least one of ITO, ITON, IZO, IZON, IZTO, and AZO.

The first protective layer 241 may be formed using sputtering. Materials for forming the first protective layer 241 may move toward the substrate 100 in a direction perpendicular or oblique to the substrate 100. Accordingly, an end portion of the first protective layer 241 may extend into a space under the first photosensitive patter layer 320 without contacting the first auxiliary layer 310. As shown in FIG. 5E, the first protective layer 241 may have a width Wp1 that is greater than a width We1 of the first counter electrode 231 to entirely cover the first counter electrode 231, and the end portion of the first protective layer 241 having a forward tapered shape may directly contact the first pixel-defining film 180.

Referring to FIG. 5D, the first anti-decapping layer 271 is formed on the first protective layer 241 in a state where the first masking pattern 300 is formed. The first anti-decapping layer 271 may be formed of a resin including fluorine and may block a strong interaction between an organic solvent and the first through third protective layers 241, 242, and 243 during a stripping process of a lift-off process.

The first anti-decapping layer 271 may be formed using thermal evaporation. Materials for forming the first anti-decapping layer 271 may move toward the substrate 100 in a direction perpendicular or oblique to the substrate 100. Accordingly, an end portion of the first anti-decapping layer 271 may extend into a space under the first photosensitive pattern layer 320 without contacting the first auxiliary layer 310. As shown in FIG. 5E, the first anti-decapping layer 271 may have a width Wd1 that is greater than the width Wp1 of the first protective layer 241 to entirely cover the first protective layer 241, and the end portion of the first anti-decapping layer 271 having a forward tapered shape may directly contact the pixel-defining film 180.

Referring to FIG. 5E, the first masking pattern 300 is removed using a lift-off process. In an exemplary embodiment, when the first auxiliary layer 310 is formed of a non-photosensitive organic material not including a fluorine-based material, the first auxiliary layer 310 may be removed using a general organic solvent.

As the first auxiliary layer 310 is removed, the first photosensitive pattern layer 320 located on the first auxiliary layer 310, portions of the first intermediate layer 221, the first counter electrode 231, the first protective layer 241, and the first anti-decapping layer 271 stacked on the first photosensitive pattern layer 320 are also removed. The first intermediate layer 221, the first counter electrode 231, the first protective layer 241, and the first anti-decapping layer 271 each having an island-type pattern remain in the first pixel P1.

Referring to FIGS. 6A and 6B, when the first anti-decapping layer 271 is not formed, in a stripping process to remove a lift-off layer formed of an organic material, the first protective layer 241 including TCO may fail to cap the first OLED 201 due to a strong interaction with a stripping solvent that is an organic solvent and may decap from the first OLED 201. Alternatively, the first protective layer 241 may decap from the first pixel P1 along with the first OLED 201. However, in the illustrated embodiment, the first anti-decapping layer 271 including fluorine may block a strong interaction between an organic solvent and the first protective layer 241 including TCO during a stripping process of a lift-off process.

Figure 5F:
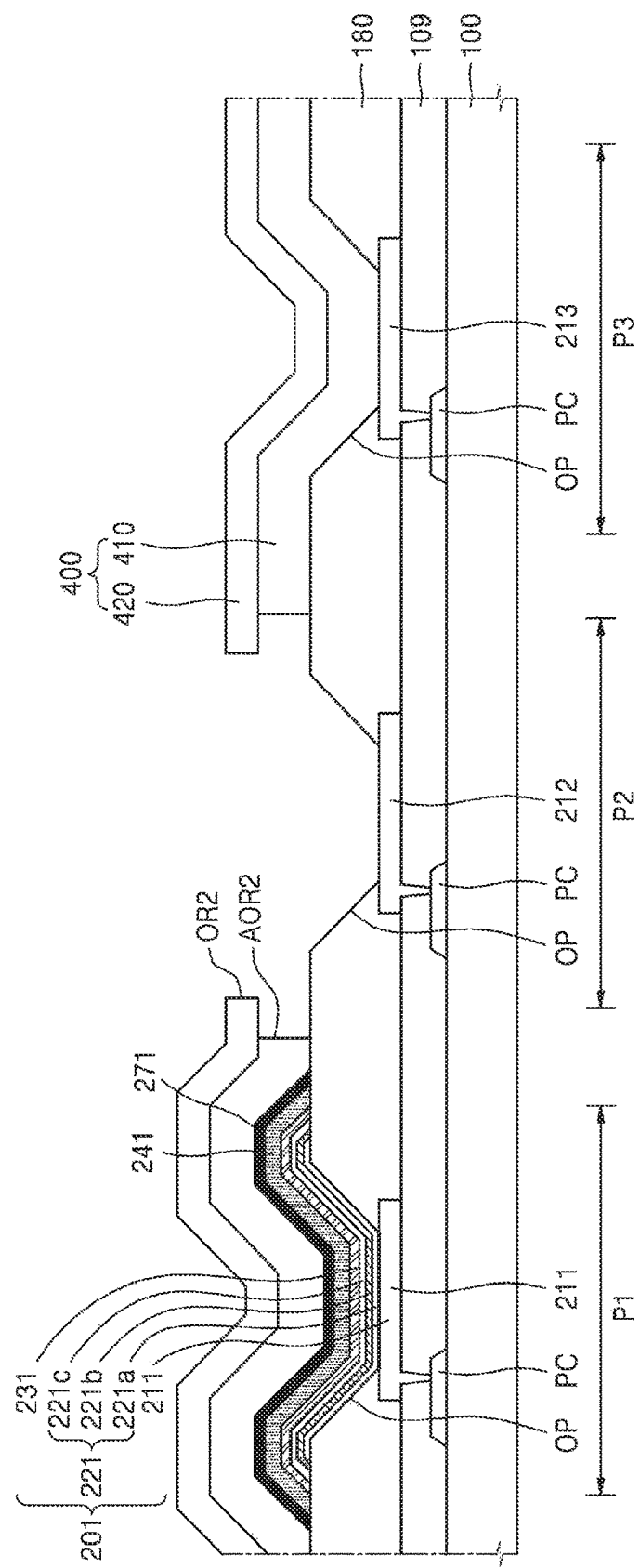

Referring to FIG. 5F, a second masking pattern 400 including a second photosensitive pattern layer 420 is formed on the first anti-decapping layer 271 and the pixel-defining film 180. The second masking pattern 400 may further include a second auxiliary layer 410 located between the second photosensitive pattern layer 420 and the pixel-defining film 180.

The second masking pattern 400 may be formed using substantially the same method as that used to form the first masking pattern 300.

For example, a non-photosensitive organic material layer is formed on the substrate 100 including the first OLED 201, the first protective layer 241, and the first anti-decapping layer 271, and a photoresist layer is formed on the non-photosensitive organic material layer. The non-photosensitive organic material may not include a fluorine-based material and the photoresist layer may include a positive photosensitive material.

The second photosensitive pattern layer 420 having a second opening portion OR2 is formed by exposing and developing a portion of the photoresist layer corresponding to the second pixel P2. The second auxiliary layer 410 having a second auxiliary opening portion AOR2 that is greater than the second opening portion OR2 is formed by etching a portion of the non-photosensitive organic material layer exposed through the second opening portion OR2.

Figure 5G:
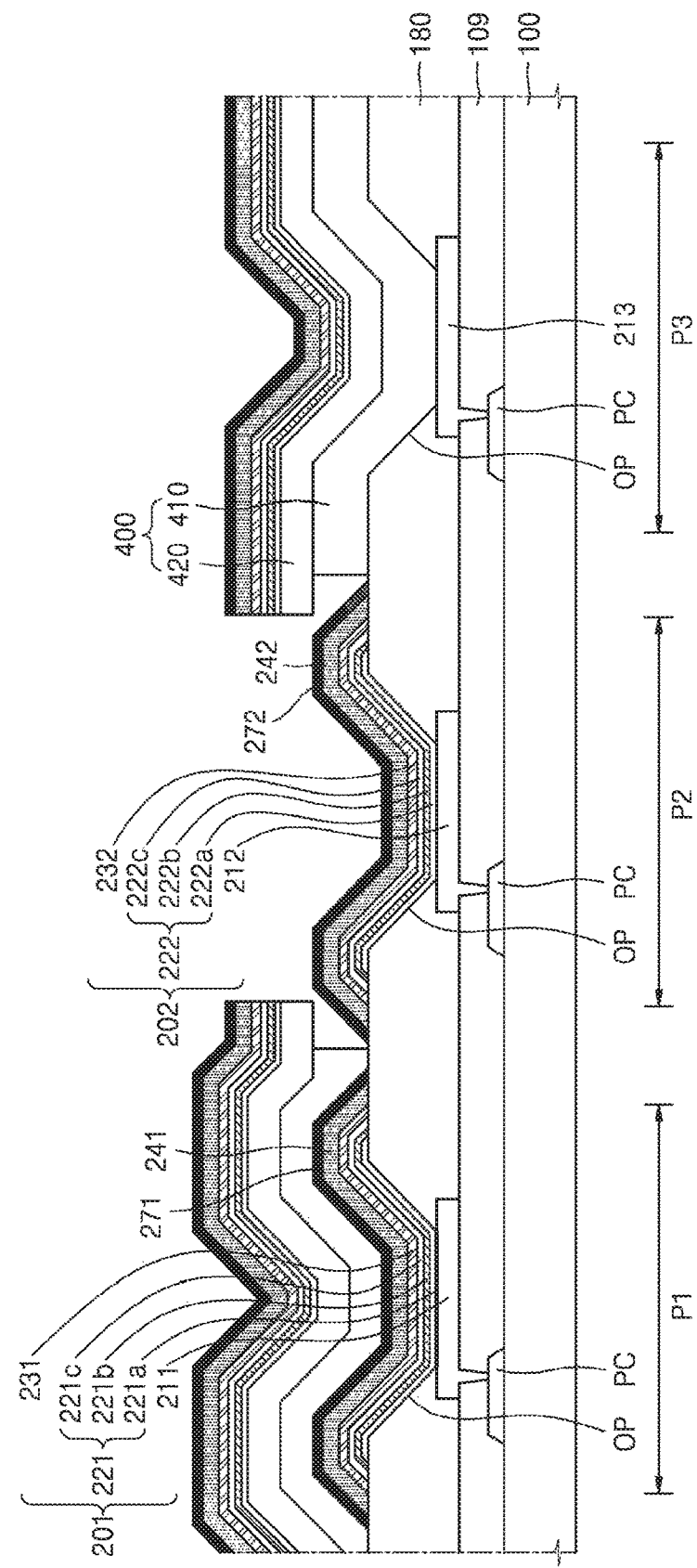

Referring to FIG. 5G, the second intermediate layer 222, the second counter electrode 232, the second protective layer 242, and the second anti-decapping layer 272 are sequentially formed on the substrate 100 and the second masking pattern 400. The second intermediate layer 222 and the second counter electrode 232 may be formed using thermal evaporation, the second protective layer 242 may be formed using sputtering, and the second anti-decapping layer 272 may be formed using thermal evaporation. Materials of the second intermediate layer 222 and the second counter electrode 232 and materials of the second protective layer 242 and the second anti-decapping layer 272 are substantially the same as those described with reference to FIG. 4, and thus a description thereof will not be given to avoid redundancy.

Figure 5H:
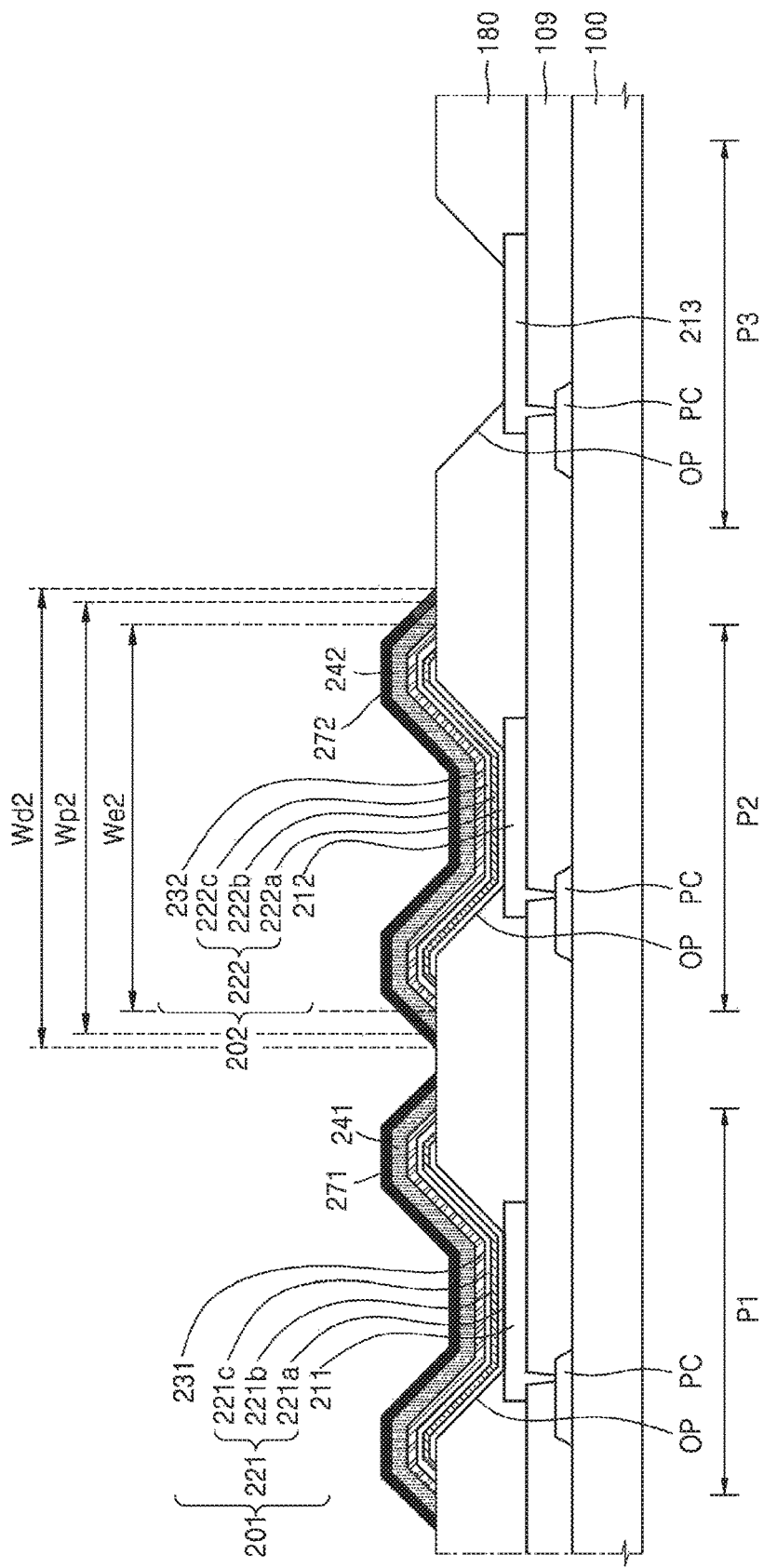

Deposition materials of the second intermediate layer 222, the second counter electrode 232, the second protective layer 242, and the second anti-decapping layer 272 may move toward the substrate 100 in a direction perpendicular or oblique to the substrate 100, and thus end portions of the second intermediate layer 222, the second counter electrode 232, the second protective layer 242, and the second anti-decapping layer 272 may extend into a space under the second photosensitive patter layer 420 without contacting the second auxiliary layer 410. As shown in FIG. 5H, the second protective layer 242 may have a width Wp2 that is greater than a width We2 of the second counter electrode 232 to entirely cover the second counter electrode 232, and the end portion of the second protective layer 242 having a forward tapered shape may directly contact the pixel-defining film 180. Also, the second anti-decapping layer 272 may have a width Wd2 that is greater than the width Wp2 of the second protective layer 242 to entirely cover the second protective layer 242, and the end portion of the second anti-decapping layer 272 having a forward tapered shape may directly contact the pixel-defining film 180.

Referring to FIG. 5H, the second masking pattern 400 is removed by using a lift-off process. In an exemplary embodiment, when the second auxiliary layer 410 is formed of a non-photosensitive organic material not including a fluorine-based material, the second auxiliary layer 410 may be removed using a general organic solvent.

As the second auxiliary layer 410 is removed, the second photosensitive pattern layer 420 located on the second auxiliary layer 410, portions of the second intermediate layer 222, the second counter electrode 232, the second protective layer 242, and the second anti-decapping layer 272 stacked on the second photosensitive pattern layer 420 are also removed. The second intermediate layer 222, the second counter electrode 232, the second protective layer 242, and the second anti-decapping layer 272 each having an island-type pattern remain in the second pixel P2.

The first protective layer 241 may prevent materials such as PGMEA included in the second masking pattern 400 on the first OLED 201 or TMAH used to develop the second masking pattern 400 from penetrating into the first OLED 201. Also, the first and second protective layers 241 and 242 may protect the first and second OLEDs 201 and 202 during a lift-off process. For example, the first and second protective layers 241 and 242 may prevent a material included in a solvent for removing the second auxiliary layer 410 from penetrating into the first and second OLEDs 201 and 202 or may prevent the first and second OLEDs 201 and 202 from being damaged due to the material. The second anti-decapping layer 272 including fluorine may block a strong interaction between an organic solvent and the second protective layer 242 during a stripping process of a lift-off process.

Figure 5I:
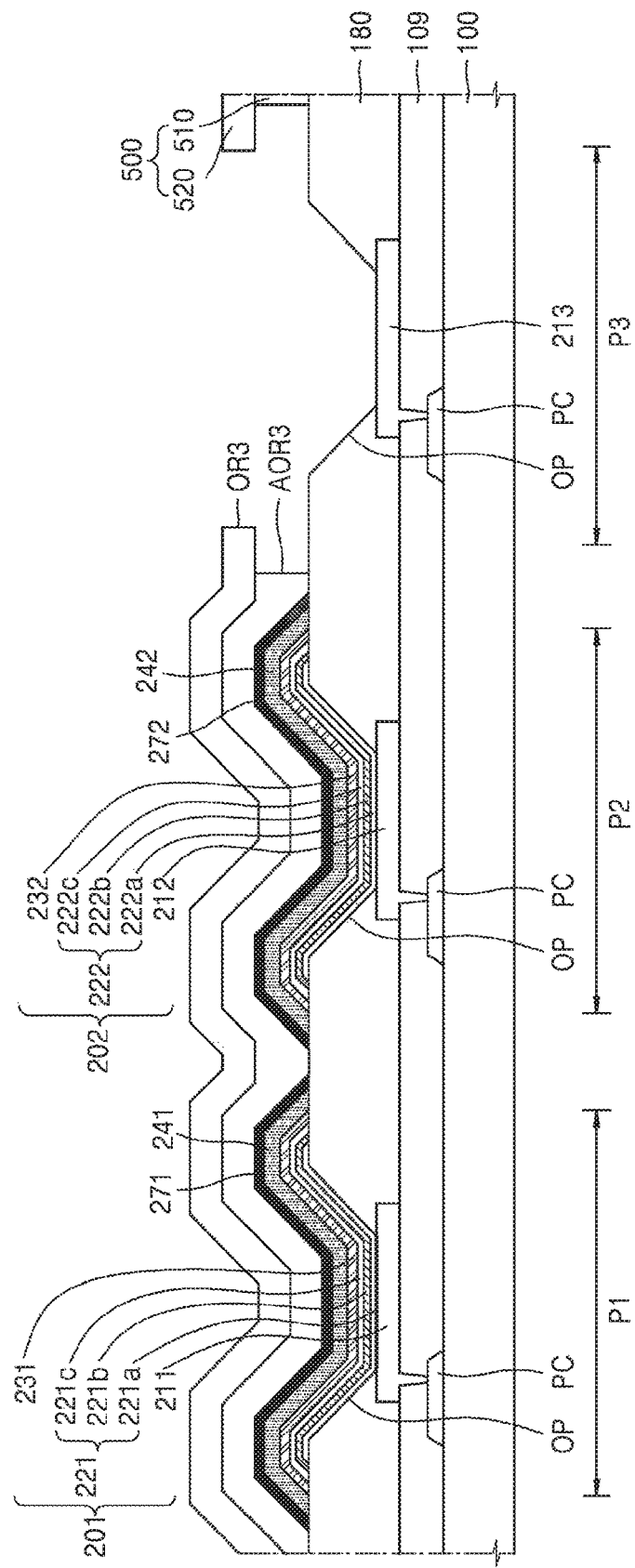

Referring to FIG. 5I, a third masking pattern 500 including a third photosensitive pattern layer 520 is formed on the first and second anti-decapping layers 271 and 272 and the pixel-defining film 180. The third masking pattern 500 may further include a third auxiliary layer 510 located between the third photosensitive pattern layer 520 and the pixel-defining film 180.

The third masking pattern 500 may be formed using substantially the same method as that used to form the first and second masking patterns 300 and 400.

For example, a non-photosensitive organic material layer is formed on the substrate 100, a photoresist layer is formed on the non-photosensitive organic material layer, and the third photosensitive pattern layer 520 having a third opening portion OR3 is formed by using exposure and development. The third auxiliary layer 510 having a third auxiliary opening portion AOR3 that is greater than the third opening portion OR3 is formed by etching a portion of the non-photosensitive organic material layer exposed through the third opening portion OR3.

Figure 5J:
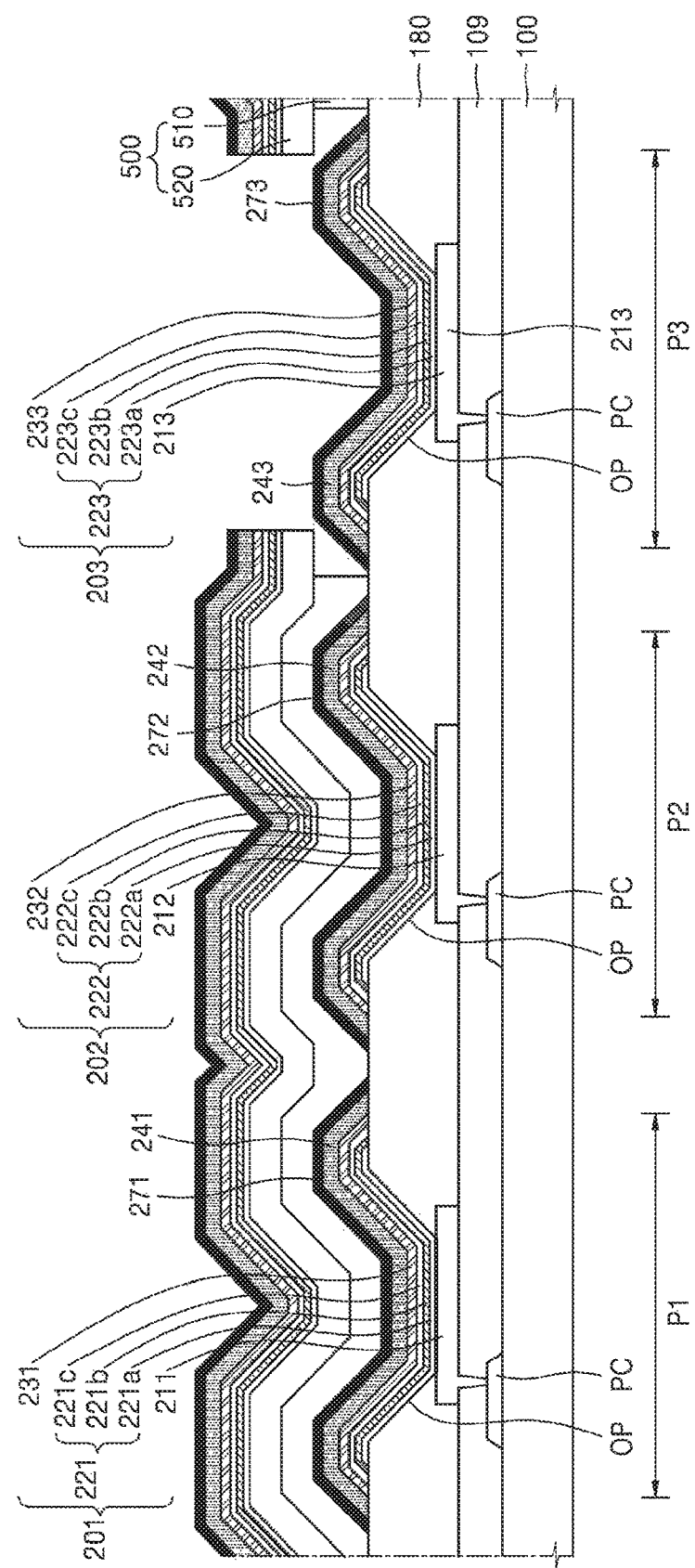

Referring to FIG. 5J, the third intermediate layer 223, the third counter electrode 233, the third protective layer 243, and the third anti-decapping layer 273 are sequentially formed on the substrate 100 and the third masking pattern 500. The third intermediate layer 223 and the third counter electrode 233 may be formed using thermal evaporation, the third protective layer 243 may be formed using sputtering, and the third anti-decapping layer 273 may be formed using thermal evaporation. Materials of the third intermediate layer 223 and the third counter electrode 233, a material of the third protective layer 243, and a material of the third anti-decapping layer 273 are substantially the same as those described with reference to FIG. 4, and thus a description thereof will not be given to avoid redundancy.

Figure 5K:
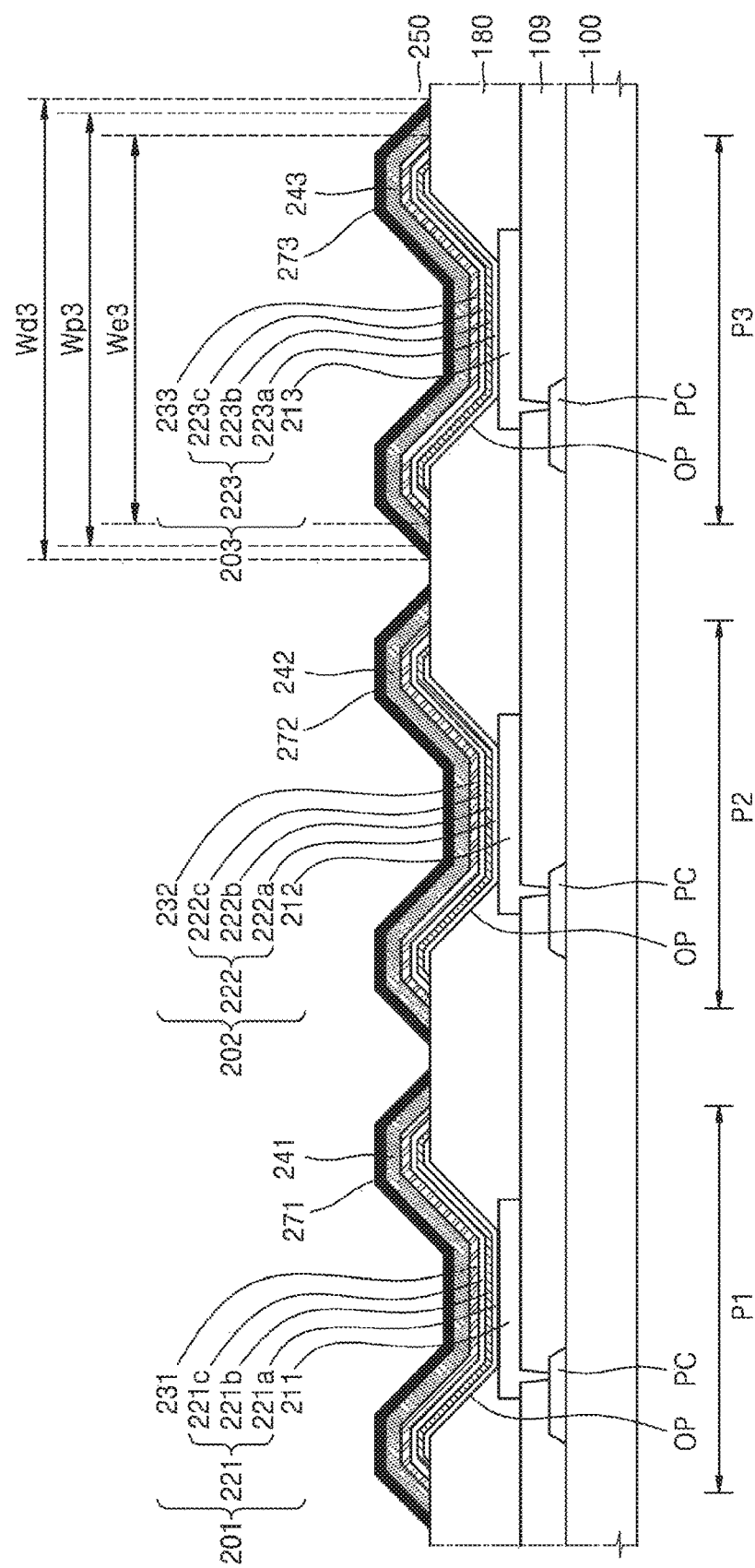

Deposition materials of the third intermediate layer 223, the third counter electrode 233, the third protective layer 243, and the third anti-decapping layer 273 may move toward the substrate 100 in a direction perpendicular or oblique to the substrate 100, and thus end portions of the third intermediate layer 223, the third counter electrode 233, the third protective layer 243, and the third anti-decapping layer 273 may extend into a space under the third photosensitive pattern layer 520 without contacting the third auxiliary layer 510. As shown in FIG. 5K, the third protective layer 243 may have a width Wp3 that is greater than a width We3 of the third counter electrode 233 to entirely cover the third counter electrode 233, and the end portion of the third protective layer 243 having a forward tapered shape may directly contact the pixel-defining film 180. Also, the third anti-decapping layer 273 may have a width Wd3 that is greater than the width Wp3 of the third protective layer 243 to entirely cover the third protective layer 243, and the end portion of the third anti-decapping layer 273 having a forward tapered shape may directly contact the pixel-defining film 180.

Referring to FIG. 5K, the third masking pattern 500 is removed using a lift-off process. In an exemplary embodiment, when the third auxiliary layer 510 is formed of a non-photosensitive organic material not including a fluorine-based material, the third auxiliary layer 510 may be removed using a general organic solvent.

As the third auxiliary layer 510 is removed, the third photosensitive pattern layer 520 located on the third auxiliary layer 510, portions of the third intermediate layer 223, the third counter electrode 233, the third protective layer 243, and the third anti-decapping layer 273 located on the third photosensitive pattern layer 520 are also removed. The third intermediate layer 223, the third counter electrode 233, the third protective layer 243, and the third anti-decapping layer 273 each having an island-type pattern remain in the third pixel P3.

The first protective layer 241 and the second protective layer 242 may prevent materials such as PGMEA included in the third masking pattern 500 on the first and second OLEDs 201 and 202 or TMAH used to develop the third masking pattern 500 from penetrating into the first and second OLEDs 201 and 202. Also, the first through third protective layers 241, 242, and 243 may protect the first through third OLEDs 201, 202, and 203 during a lift-off process. For example, the first through third protective layers 241, 242, and 243 may prevent a material included in a solvent for removing the third auxiliary layer 510 from penetrating into the first through third OLEDs 201, 202, and 203 or may prevent the first through third OLEDs 201, 202, and 203 from being damaged due to the material. The third anti-decapping layer 273 including fluorine may block a strong interaction between an organic solvent and the third protective layer 243 during a stripping process of a lift-off process.

Figure 5L:
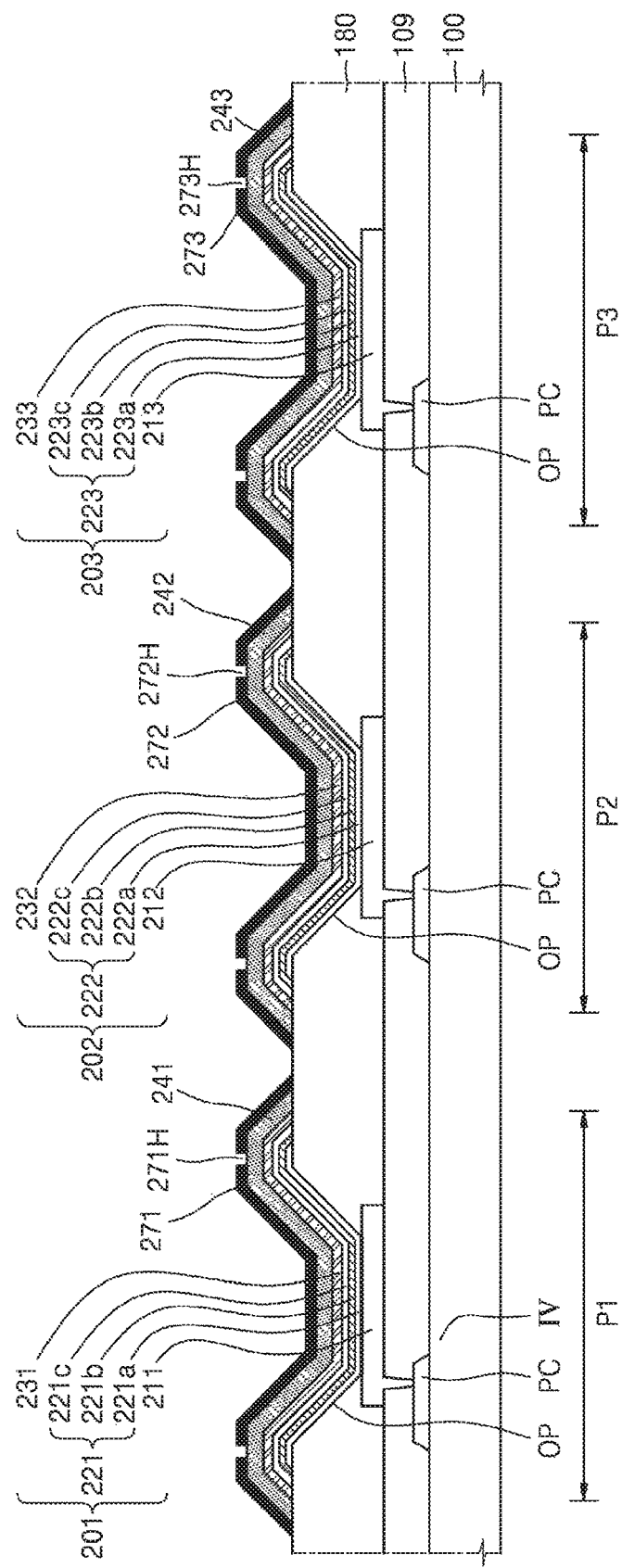

Referring to FIG. 5L, the first through third through-holes 271H, 272H, and 273H through which the top surfaces of the first through third protective layers 241, 242, and 243 are exposed are formed on top surfaces of the first through third anti-decapping layers 271, 272, and 273.

The first through third through-holes 271H, 272H, and 273H formed in the first through third anti-decapping layers 271, 272, and 273 formed of a non-conductive material function as paths through which the first through counter electrodes 231, 232, and 233 and the first through third protective layers 241, 242, and 243 formed of a conductive material are electrically connected to the connection layer 250.

Figure 5M:
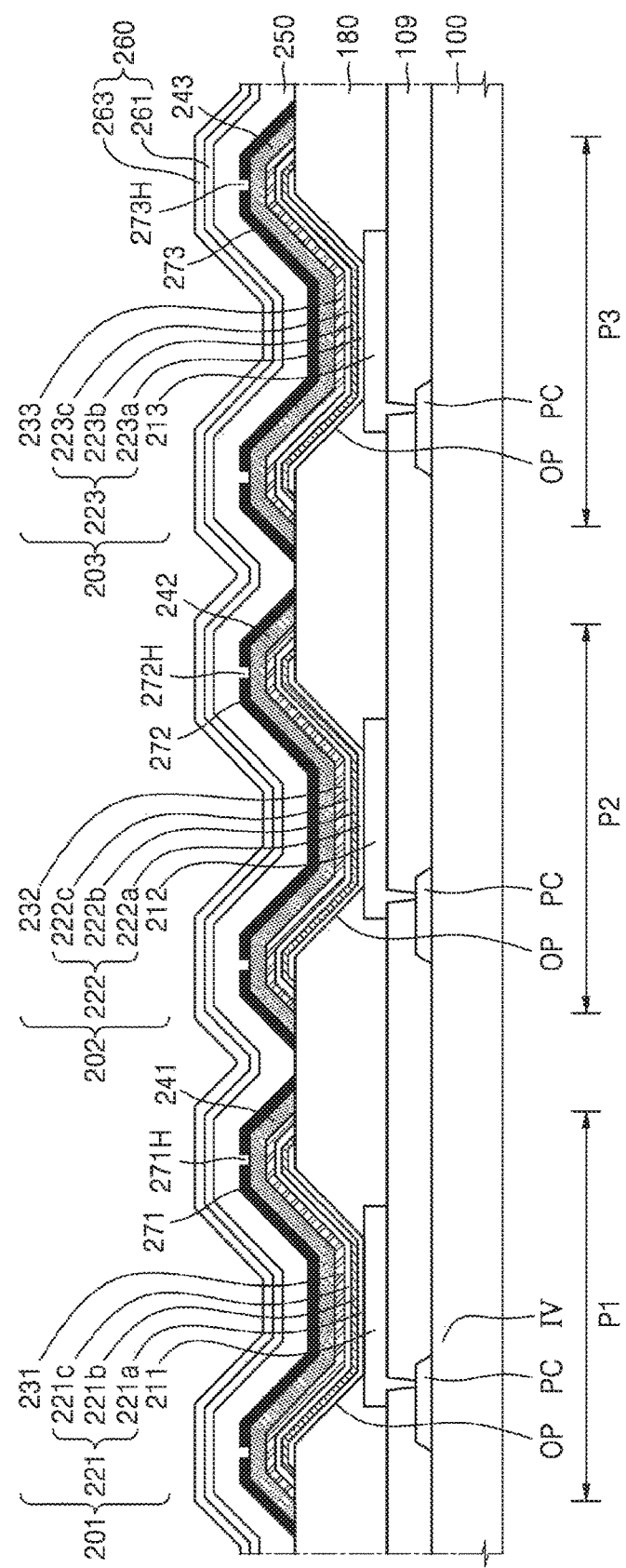

Referring to FIG. 5M, the connection layer 250 is formed on the substrate 100 including the first through third anti-decapping layers 271, 272, and 273. The connection layer 250 is integrally formed on the substrate 100 to entirely cover the first through third pixels P1, P2, and P3. The connection layer 250 includes a conductive material. A material used for the connection layer 250 is substantially the same as that described with reference to FIG. 4.

Thereafter, the encapsulation thin film 260 is formed on the connection layer 250. The encapsulation thin film 260 may include at least one organic layer 261 and at least one inorganic layer 263.

The organic layer 261 may include a polymer-based material. In an exemplary embodiment, the organic layer 261 may be formed by depositing a liquid (or gaseous) monomer and curing a deposit including the monomer using light such as ultraviolet rays or heat. The inorganic layer 263 may include at least one of SiON, SiNx, and SiOx. The inorganic layer 263 may be formed using plasma-enhanced chemical vapor deposition (PECVD).

Although the inorganic layer 263 is located over the organic layer 261 in the illustrated embodiment, the inventive concepts are not limited thereto. In another exemplary embodiment, positions of the organic layer 261 and the inorganic layer 263 may be changed and the stacking order and the number of layers may be varied.

Although the first through third masking patterns 300, 400, and 500 respectively include the first through third auxiliary layers 310, 410, and 510 in FIGS. 5A through 5M, the inventive concepts are not limited thereto. The first through third masking patterns 300, 400, and 500 may include only the first through third photosensitive pattern layers 320, 420, and 520 without the first through third auxiliary layers 310, 410, and 510.

Figure 8A:
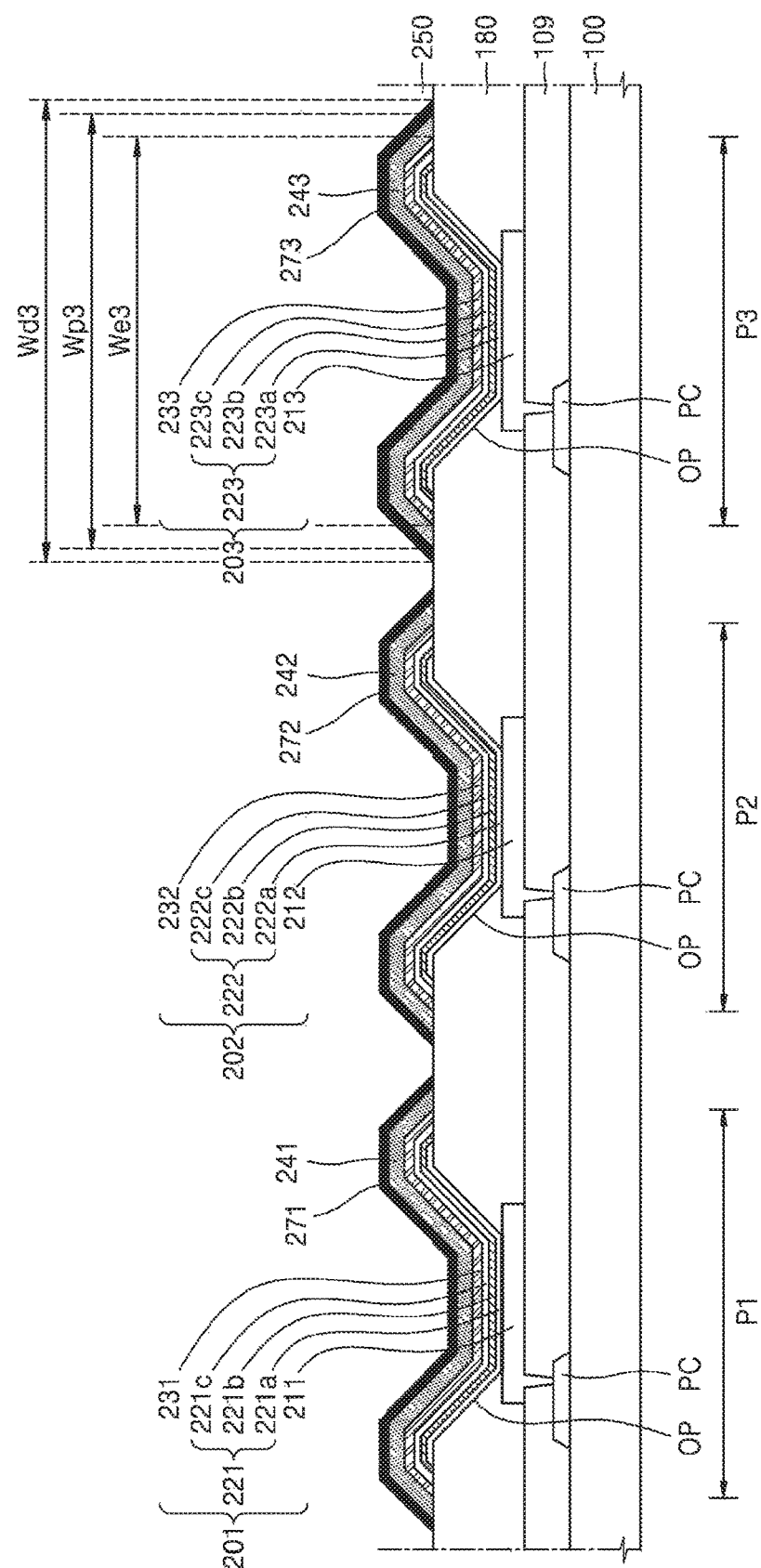

FIG. 7 is a schematic cross-sectional view of a second embodiment of an organic light-emitting display apparatus constructed according to the principles of the invention. FIGS. 8A and 8B are schematic cross-sectional views of the organic light-emitting display apparatus of FIG. 7 illustrating a part of an exemplary method of manufacturing the organic light-emitting display apparatus.

Referring to FIG. 7, the organic light-emitting display apparatus 2 according to the second embodiment is substantially the same as the organic light-emitting display apparatus 1 of FIG. 4 except for anti-decapping particles 2720, and thus the following description will focus on the differences.

The first through third pixels P1, P2, and P3 include the pixel circuits PC and the first through third OLEDs 201, 202, and 203 electrically connected to the pixel circuits PC, and the first through third pixel electrodes 211, 212, and 213, the first through third intermediate layers 221, 222, and 223, and the first through third counter electrodes 231, 232, and 233 constituting the first through third OLEDs 201, 202, and 203 are substantially the same as those described in the first embodiment. Also, the first through third protective layers 241, 242, and 243 located on the first through third counter electrodes 231, 232, and 233 are also substantially the same as those described in the first embodiment.

However, unlike in the first embodiment, the first through third anti-decapping layers 271, 272, and 273 (see FIG. 4) including island-type patterns and covering the first through third protective layers 241, 242, and 243 are not provided on the first through third protective layers 241, 242, and 243 according to the second embodiment. Instead, the anti-decapping particles 2720 may exist as distributed particles on the first through third protective layers 241, 242, and 243.

Since the anti-decapping layer 2720 is provided as distributed particles, unlike in the first embodiment, the first through third through-holes 271H, 272H, and 273H do not need to be formed in the first through third anti-decapping layers 271, 272, and 273 (see FIG. 4) that are non-conductive in order to electrically connect the connection layer 250 to the first through third protective layers 241, 242, and 243 that are conductive.

Through spaces between the distributed particles, the connection layer 250 directly contacts the first through third protective layers 241, 242, and 243 that are conductive and the first through third protective layers 241, 242, and 243 directly contact the first through third counter electrodes 231, 232, and 233, thereby preventing a voltage drop in a common voltage applied to the first through third OLEDs 201, 202, and 203.

A state in FIG. 8A is substantially the same as that in FIG. 5K of the first embodiment. That is, in a state where operations of FIGS. 5A through 5J are finished and the first through third masking patterns 300, 400, and 500 are formed, the first through third pixel electrodes 211, 212, and 213, the first through third intermediate layers 221, 222, and 223, the first through third counter electrodes 231, 232, and 233, the first through third protective layers 241, 242, and 243, and the first through third anti-decapping layers 271, 272, and 273 are sequentially stacked in the first through third pixels P1, P2, and P3.

Referring to FIG. 8B, unlike in FIG. 5L of the first embodiment, instead of forming through-holes in top surfaces of the first through third anti-decapping layers 271, 272, and 273, the first through third anti-decapping layers 271, 272, and 273 respectively formed on the first through third protective layers 241, 242, and 243 are removed.

In a state where the first through third masking patterns 300, 400, and 500 are formed, the first through third anti-decapping layers 271, 272, and 273, each formed of a resin including fluorine, are formed to block a strong interaction between a stripping solvent that is an organic solvent and the first through third protective layers 241, 242, and 243 including TCO. The first through third anti-decapping layers 271, 272, and 273 are removed thereafter.

The first through third anti-decapping layers 271, 272, and 273 may be removed by using plasma treatment. However, since it is difficult to completely remove the first through third anti-decapping layers 271, 272, and 273, the anti-decapping particles 2720 may remain as distributed particles on the first through third protective layers 241, 242, and 243.

Since an organic light-emitting display apparatus constructed according to the principles of the invention is not formed in a state where a deposition mask formed of INVAR or the like is in close contact with a substrate, the deposition mask may be prevented from inappropriately touching the substrate. Also, an additional spacer for supporting the deposition mask does not need to be formed on a pixel-defining film or the pixel-defining film does not need to be formed to have a large thickness ranging from about 2.5 µm to about 3.5 µm. That is, since the pixel-defining film may be formed to have a small thickness of about 100 nm or less, processes may be simplified and manufacturing costs may be reduced.

According to an exemplary embodiment, since an emission layer is formed using a lift-off process without using a fine metal mask (FMM), a high-resolution display panel may be formed.

Also, a protective layer including TCO may prevent damage to an OLED, and using a general organic resin instead of fluorine that is expensive as a pattern forming material in a masking pattern process may reduce manufacturing costs.

An anti-decapping layer including fluorine that has low surface energy may prevent the protective layer from decapping when stripping a lift-off layer, thereby reducing or preventing damage to the OLED.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. An organic light-emitting display apparatus comprising:
    a first pixel electrode and a second pixel electrode disposed on a substrate;
    a pixel-defining film disposed on the first pixel electrode and the second pixel electrode and having openings through which the first pixel electrode and the second pixel electrode are exposed;
    a first intermediate layer and a second intermediate layer respectively disposed on the first pixel electrode and the second pixel electrode, the first intermediate layer and the second intermediate layer respectively comprising a first emission layer and a second emission layer;
    a first counter electrode and a second counter electrode respectively disposed on the first intermediate layer and the second intermediate layer;
    a first layer and a second layer respectively disposed on the first counter electrode and the second counter electrode and comprising fluorine; and
    a connection layer disposed on the first layer and the second layer and electrically connected to the first counter electrode and the second counter electrode.

2. The organic light-emitting display apparatus of claim 1, further comprising:
    a first protective layer and a second protective layer respectively disposed on the first counter electrode and the second counter electrode.

3. The organic light-emitting display apparatus of claim 2, wherein the first protective layer and the second protective layer respectively have island-type patterns.

4. The organic light-emitting display apparatus of claim 2, wherein each of the first protective layer and the second protective layer comprises a transparent conductive oxide.

5. The organic light-emitting display apparatus of claim 2, wherein the first protective layer has a width greater than a width of the first counter electrode, and the second protective layer has a width greater than a width of the second counter electrode.

6. The organic light-emitting display apparatus of claim 5, wherein an end portion of each of the first protective layer and the second protective layer directly contacts the pixel-defining film.

7. The organic light-emitting display apparatus of claim 2, wherein the first layer and the second layer have island-type patterns covering the first protective layer and the second protective layer.

8. The organic light-emitting display apparatus of claim 7, wherein the first layer and the second layer have through-holes through which top surfaces of the first protective layer and the second protective layer are exposed,
wherein the first protective layer and the second protective layer directly contact the connection layer through the through-holes.

9. The organic light-emitting display apparatus of claim 7, wherein the first layer has a width greater than a width of the first protective layer, and the second layer has a width greater than a width of the second protective layer.

10. The organic light-emitting display apparatus of claim 2, wherein the first layer and the second layer are disposed on the first protective layer and the second protective layer, and each comprises distributed particles.

11. The organic light-emitting display apparatus of claim 10, wherein the first protective layer and the second protective layer directly contact the connection layer through spaces between the distributed particles of the first layer and the second layer.

12. The organic light-emitting display apparatus of claim 1, wherein the first counter electrode and the second counter electrode respectively have island-type patterns.

* * * * *